US012763783B2

(12) United States Patent
Demirkan et al.

(10) Patent No.: US 12,763,783 B2
(45) Date of Patent: Oct. 13, 2026

(54) CLOSED LOOP DAC GLITCH MITIGATION

(71) Applicant: Analog Devices International Unlimited Company, Limerick (IE)

(72) Inventors: Murat Demirkan, Istanbul (TR); Michael E. Harrell, Colorado Springs, CO (US); Dennis A. Dempsey, Newport (IE); Zahit Evren Kaya, Izmit (TR)

(73) Assignee: Analog Devices International Unlimited Company, Limerick (IE)

( * ) Notice: Subject to any disclaimer, the term of this patent is extended or adjusted under 35 U.S.C. 154(b) by 536 days.

(21) Appl. No.: 18/227,027

(22) Filed: Jul. 27, 2023

(65) Prior Publication Data

US 2024/0097690 A1 Mar. 21, 2024

Related U.S. Application Data

(60) Provisional application No. 63/376,467, filed on Sep. 21, 2022.

(51) Int. Cl.
*H03F 3/04* (2006.01)
*H03M 1/06* (2006.01)

(52) U.S. Cl.
CPC ............ *H03M 1/0604* (2013.01); *H03F 3/04* (2013.01)

(58) Field of Classification Search
CPC .. H03M 1/0604; H03M 1/007; H03M 1/0863; H03M 1/1038; H03M 1/74;
(Continued)

(56) References Cited

U.S. PATENT DOCUMENTS 4,198,608 A 4/1980 Comley
7,956,786 B2 6/2011 Cosgrave
(Continued)

FOREIGN PATENT DOCUMENTS

JP H04115627 4/1992
JP 2004104269 4/2004
(Continued)

OTHER PUBLICATIONS

"Japanese Application Serial No. 2023-152245, Notification of Reasons for Rejection mailed Nov. 4, 2025", w/ English Translation, 19 pgs.
(Continued)

*Primary Examiner* — Hieu P Nguyen
(74) *Attorney, Agent, or Firm* — Schwegman Lundberg & Woessner, P.A.

(57) ABSTRACT

A method of feedback control of an amplifier system includes driving multiple amplifier circuits using at least one digital-to-analog converter (DAC) circuit to set a system output of the amplifier system, operating the at least one DAC circuit using a first set of DAC codes to set the system output to a steady state target output, detecting a high glitch transition of the first set of DAC codes that is greater than a specified threshold transition, and changing to operating the at least one DAC circuit using a second set of DAC codes to set the system output to substantially the same steady state target output, wherein operating the at least one DAC circuit using the second set of DAC codes reduces glitch energy at the output of the at least one DAC circuit.

19 Claims, 29 Drawing Sheets

(58) Field of Classification Search
CPC . H03F 3/04; H03G 3/12; H03G 11/00; H03G 3/001
USPC ...................................... 330/291, 295, 124 R
See application file for complete search history.

(56) References Cited

U.S. PATENT DOCUMENTS

| | | | | |
|---|---|---|---|---|
| 9,590,648 | B2 * | 3/2017 | La Grou ................ | H03M 1/66 |
| 2009/0121908 | A1 | 5/2009 | Regier | |
| 2014/0009129 | A1 | 1/2014 | Shimizu et al. | |
| 2022/0190800 | A1 | 6/2022 | Turvey et al. | |

FOREIGN PATENT DOCUMENTS

| | | |
|---|---|---|
| JP | 2005284589 | 10/2005 |
| JP | 2016054446 | 4/2016 |
| JP | 2021043198 | 3/2021 |

OTHER PUBLICATIONS

"Japanese Application Serial No. 2023-152245, Response filed Jan. 15, 2026 to Notification of Reasons for Rejection mailed Nov. 4, 2025", W/English Claims, 13 pgs.

* cited by examiner

CLOSED LOOP DAC GLITCH MITIGATION

CLAIM OF PRIORITY

This application claims priority to U.S. Provisional Application Ser. No. 63/376,467, filed Sep. 21, 2022, which is incorporated by reference herein in its entirety.

FIELD OF THE DISCLOSURE

This document pertains generally, but not by way of limitation, to circuit supply systems that provide a regulated output, and more particularly, to amplifier system systems that use digital to analog converters to provide a regulated output over a large dynamic range.

BACKGROUND

Amplifier systems can be used to as a circuit supply to provide a direct current (DC) output. These systems can be useful for example in automatic test equipment (ATE). It can be desirable for circuit supply in a test environment to have a large dynamic range. One approach to increase the dynamic range of ATE is to transition the ATE between multiple operating modes using digital to analog converters (DACs). However, using DACs in closed loop regulated supplies can cause glitching, which is undesirable.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
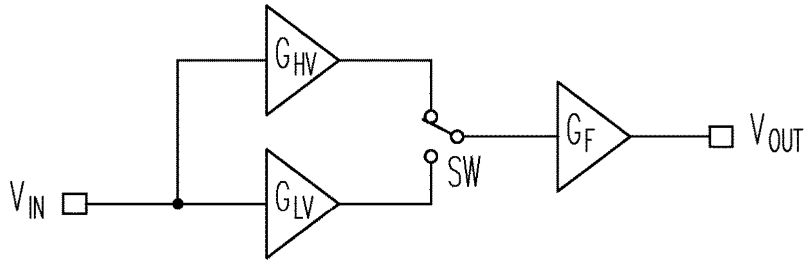
FIG. 1 is a diagram of an example of an electronic circuit that includes an amplifier system.

FIG. 1 is a diagram of an example of an electronic circuit with an amplifier system having a switch-selectable transfer function gain to apply to an input signal ($V_{IN}$) to provide a lower resolution but high voltage (HV) range, and a higher resolution but low voltage (LV) range. The amplifier system includes a circuit path providing a higher signal gain ($G_{HV}$) to the input signal, and a circuit path providing a lower signal gain ($G_{LV}$) to the input signal. The HV range circuit path or the LV range circuit path is selected using a switch mechanism (SW) that enables the desired circuit path.

The signal gains from input ($V_{IN}$) to output ($V_{OUT}$) are designated as $G_{HV}$ and $G_{LV}$ for the lower resolution HV range circuit path and the higher resolution LV range circuit path, respectively, where $G_{HV}>G_{LV}$. The input to output transfer functions is determined by one of the following equations, depending on the state of the gain select switch and assuming the forward gain $G_F$ is substantially unity:

$$V_{OUT(HV\ Range)} = V_{IN} G_{HV},$$

$$V_{OUT(LV\ Range)} = V_{IN} G_{LV}.$$

The input $V_{IN}$ can be normalized so that: $0V \le V_{IN} \le 1V$.

Figure 2:
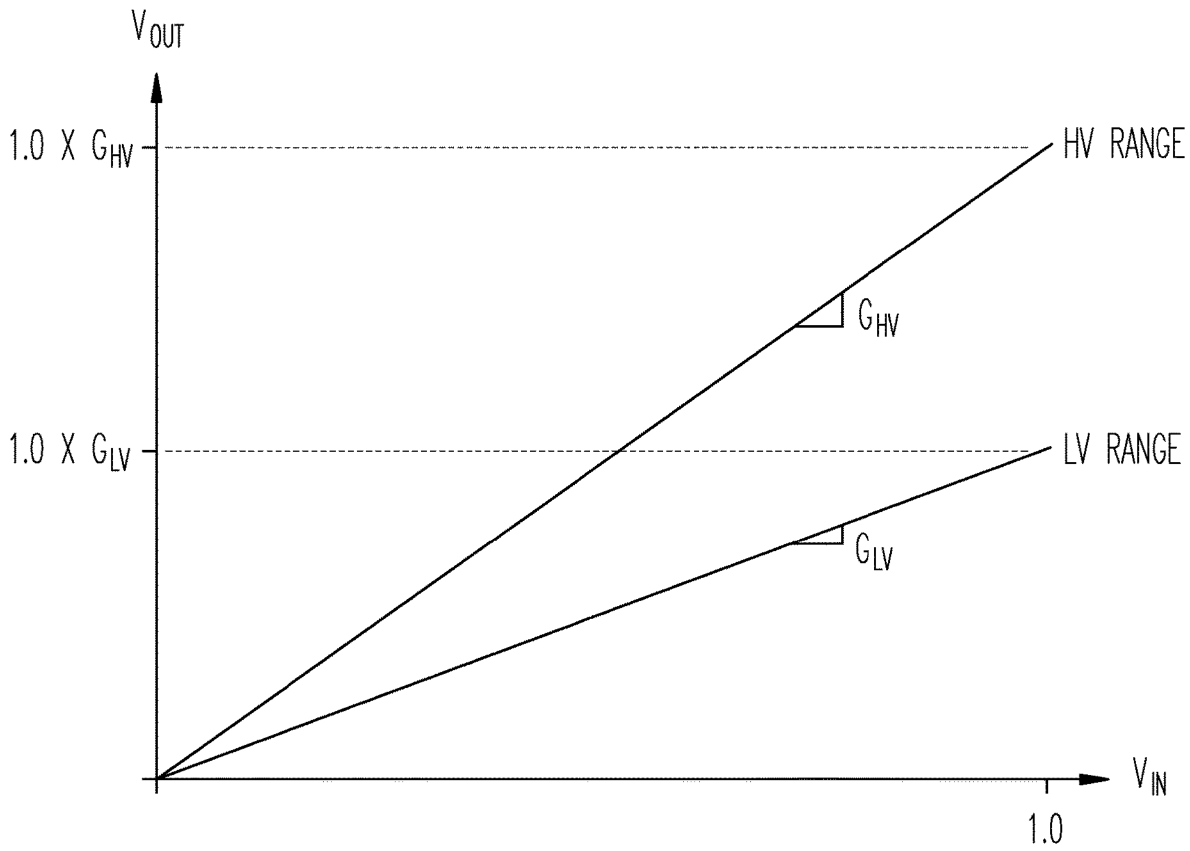
FIG. 2 is an illustration of an example of a transfer function for the circuit of FIG. 1.

FIG. 2 is an illustration of the output voltage $V_{OUT}$ as a function of $V_{IN}$ for the HV range and the LV range. The HV range graph has slope $G_{HV}$ and the LV range graph has slope $G_{LV}$. When operating at an output voltage common to the span of both the HV and LV ranges, it may be desirable to switch between the two range settings without inducing a voltage disturbance (e.g., a signal glitch) or aberration at the output. This glitch mitigation is only possible for a range of operating voltages $V_{OUT}$ that are common to the span of both the HV and LV ranges.

However, even for only those output voltages common to both the HV and LV ranges, for a constant input voltage ($V_A$) there will be an aberration at the output when the switch is changed between circuit paths. This is true for all operating points except the one where the two graphs intersect (at $V_{IN}$=0V for the example of FIG. 2). This is because for all points not at the intersection, the output will take a different voltage for a corresponding input $V_A$ according to the different transfer functions defined above.

Figure 3:
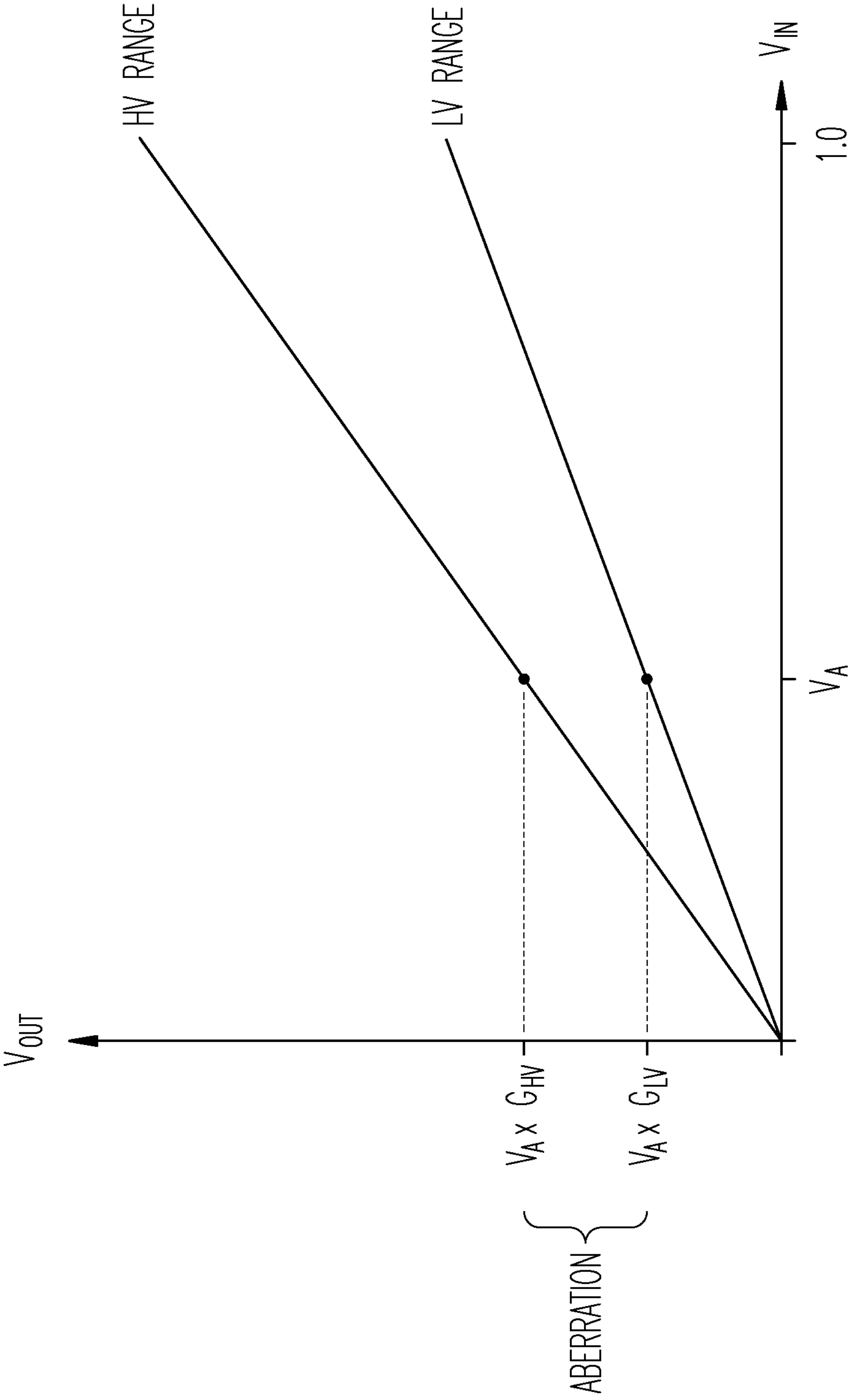
FIG. 3 is an illustration of another example of a transfer function for the circuit of FIG. 1.

FIG. 3 illustrates graphs of $V_{OUT}$ as a function of $V_{IN}$ for the HV range and LV range. The graphs show the aberration for the operating point $V_{IN}=V_A$ where the two output graphs do not intersect ($V_A$>0V). As shown in the graph of FIG. 3, the aberration would be the difference $V_A[G_{HV}-G_{LV}]$ for an input $V_A$ when the position of the switch in FIG. 1 is changed between the HV range circuit path and the LV range circuit path.

Figure 4:
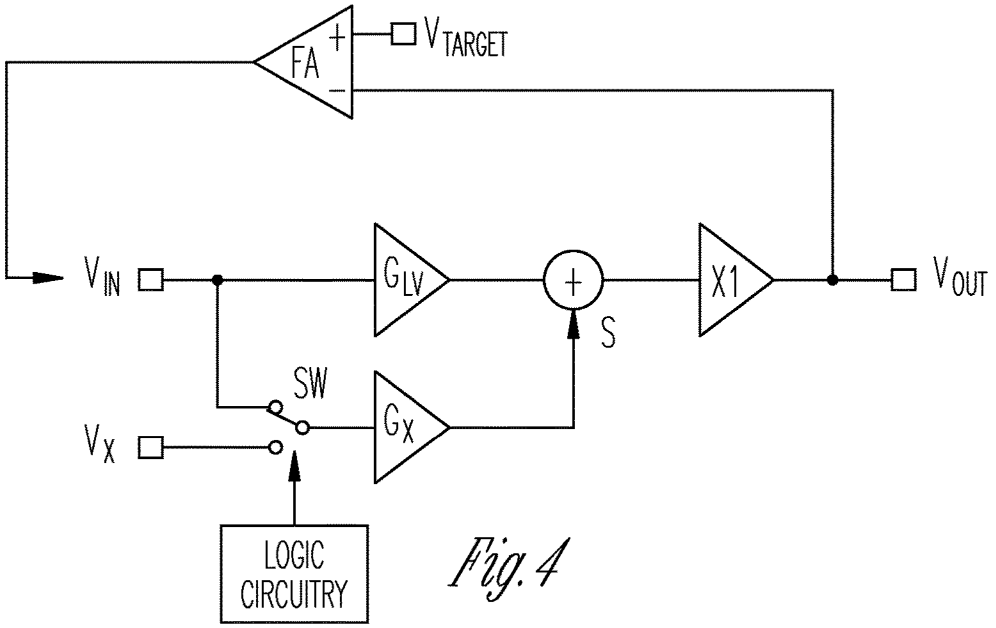
FIG. 4 is a diagram of another example of an electronic circuit that includes an amplifier system.

FIG. 4 is a circuit schematic of an example of an amplifier system to switch between a HV range and a LV range. The $G_{HV}$ amplifier has been removed and the switch SW is located on the input side of the $G_{LV}$ and a $G_X$ amplifier. The transfer function of the overall LV range is now:

$$V_{OUT} = V_{IN}G_{LV} + V_XG_X,$$

where gain $G_X$ may be chosen arbitrarily.

The feedback amplifier (FA) automatically adjusts input voltage $V_{IN}$ to the appropriate voltage so that the output ($V_{OUT}$) is moved toward the desired target signal $V_{TARGET}$. The amplifier system is in steady state when the output ($V_{OUT}$) is held at, or near (e.g., within an error margin), the desired target signal $V_{TARGET}$. The switch SW allows the amplifier system to realize the gain $G_{HV}$ without the $G_{HV}$ amplifier. With the switch in the upper setting (as shown in FIG. 4) the gain from $V_{IN}$ to $V_{OUT}$ is $G_{LV}+G_X=G_{HV}$, and by changing the switch to the lower setting the total gain is $G_{LV}$ but with a static offset determined by $V_X$ and $G_X$. The feedback mechanism will act to hold the output at this target even if the LV range transfer function as shown in the LV range graph is slowly translated from one common mode span to another by changing $V_X$. The logic circuitry 402 can include one or more of a processor, state machine, filed programmable gate array (FPGA), application specific integrated circuit (ASIC), or other logic circuitry to change the values of $V_{IN}$ and $V_X$.

Figure 5:
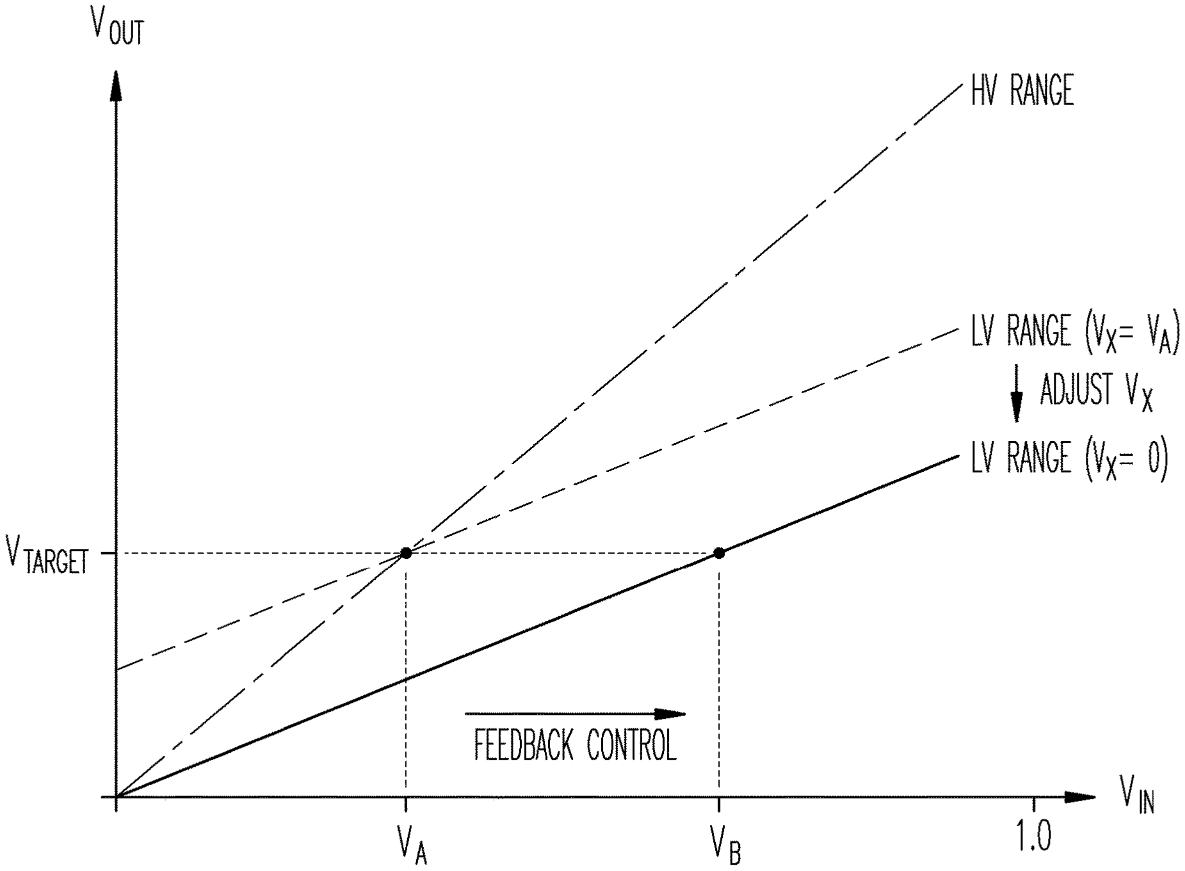
FIG. 5 is an illustration of an example of a transfer function for the circuit of FIG. 4.

FIG. 5 are graphs of the HV range and LV range that illustrate operation of the circuit of FIG. 4 where the LV range is transitioned from the intersecting condition back down to a preferred common mode span. In the example shown in FIG. 5, the $V_X$ voltage is ramped down from $V_A$ to 0V. The feedback mechanism automatically and dynamically adjusts $V_{IN}$ in such a way (from $V_A$ to VB) to maintain $V_{TARGET}$ at the output, even while $V_X$ is being adjusted (e.g., using a digital-to-analog converter (DAC) or other logic circuitry), thereby shifting the LV graph without disturbing the output. Aberrations in the output can be eliminated provided $V_X$ is made to match $V_{IN}$ before the switch setting is changed.

Figure 6:
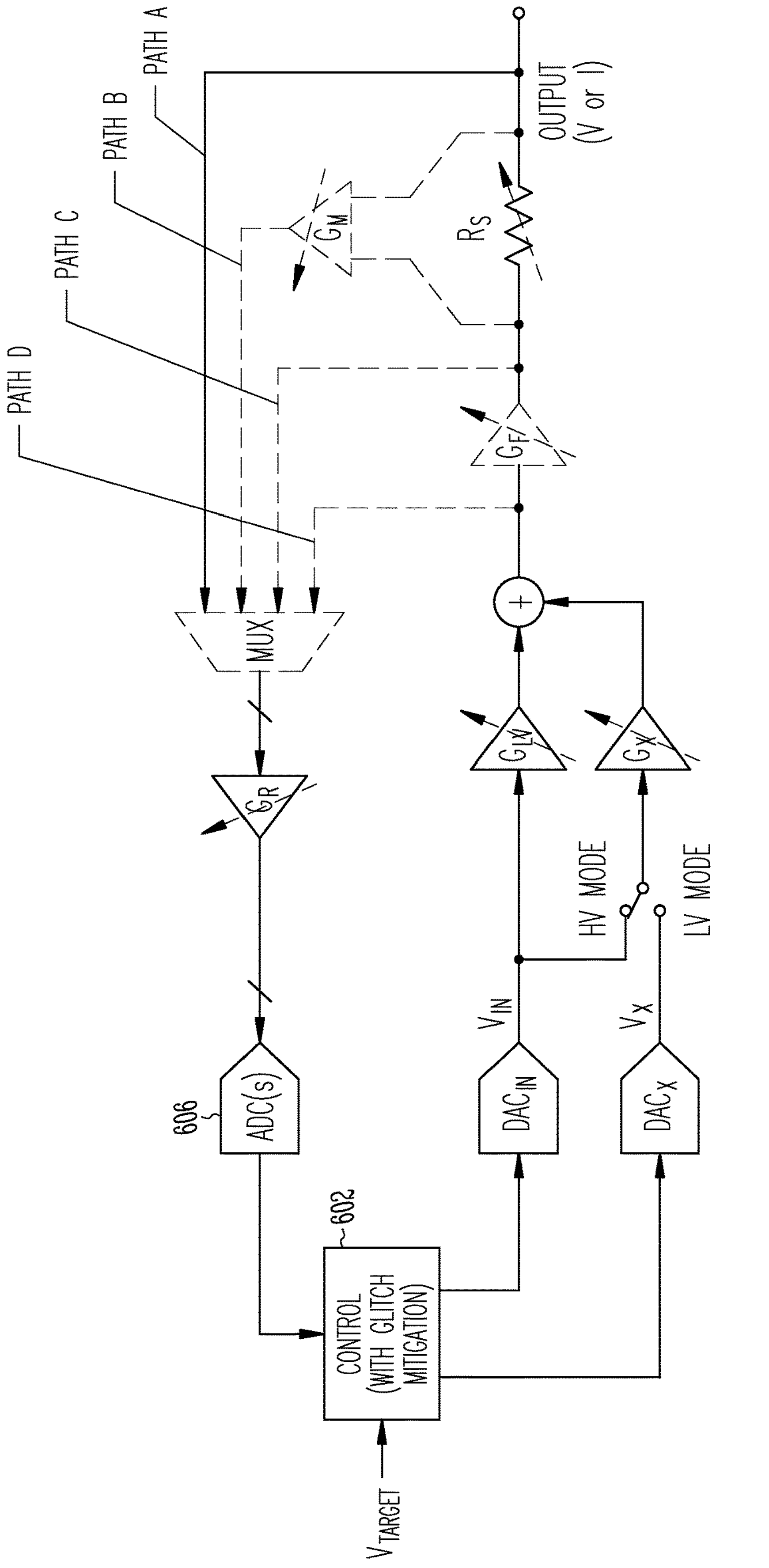
FIG. 6 is a diagram of an example of an electronic circuit that includes an amplifier system having multiple digital-to-analog converters (DACs).

FIG. 6 is a circuit schematic of another example of an amplifier system where the input voltages $V_{IN}$, $V_X$, are created by digital-to-analog converters ($DAC_{IN}$ and $DAC_X$). In addition, the feedback amplifier (FA) is replaced with an analog-to-digital converter (ADC) 606 combined with a control circuit 602 that provides suitable control of the DACs and ADC 606. The control circuit 602 may be implemented using a processor (e.g., a microprocessor), state machine, field programmable gate array (FPGA), application specific integrated circuit (ASIC), or other logic circuitry. The amplifier system may be included in a system on chip (SoC) IC, a system in package (SiP), or made from multiple components.

The auxiliary signal gain $G_X$ and the LV signal gain $G_{LV}$ of the $G_X$ and $G_{LV}$ amplifier circuits can be adjustable. With the switch SW in the HV low-resolution mode (as shown in FIG. 6) the gain from $V_{IN}$ to $V_{OUT}$ is $G_{LV}+G_X=G_{HV}$, and by changing the switch to the LV high-resolution mode the total gain is $G_{LV}$ but with a static offset determined by $V_X$ and $G_X$ as in the example of FIG. 4. Forward gain $G_F$ can be added in the forward path to the output or the reverse gain GR in the feedback path. A second ADC 608 can optionally be used to monitor the output current using sense impedance $R_S$. The sense impedance $R_S$ can include an impedance circuit element such as a resistor or an active device impedance. The sense impedance can include unit resistors or unit impedances that can be made up of a combination of impedance of different types and sizes to achieve particular characteristics (e.g., balancing temperature coefficients). Such impedances may be calibrated, trimmed, or tuned. The gain Gm to monitor the output current may also be adjustable.

Figure 7:
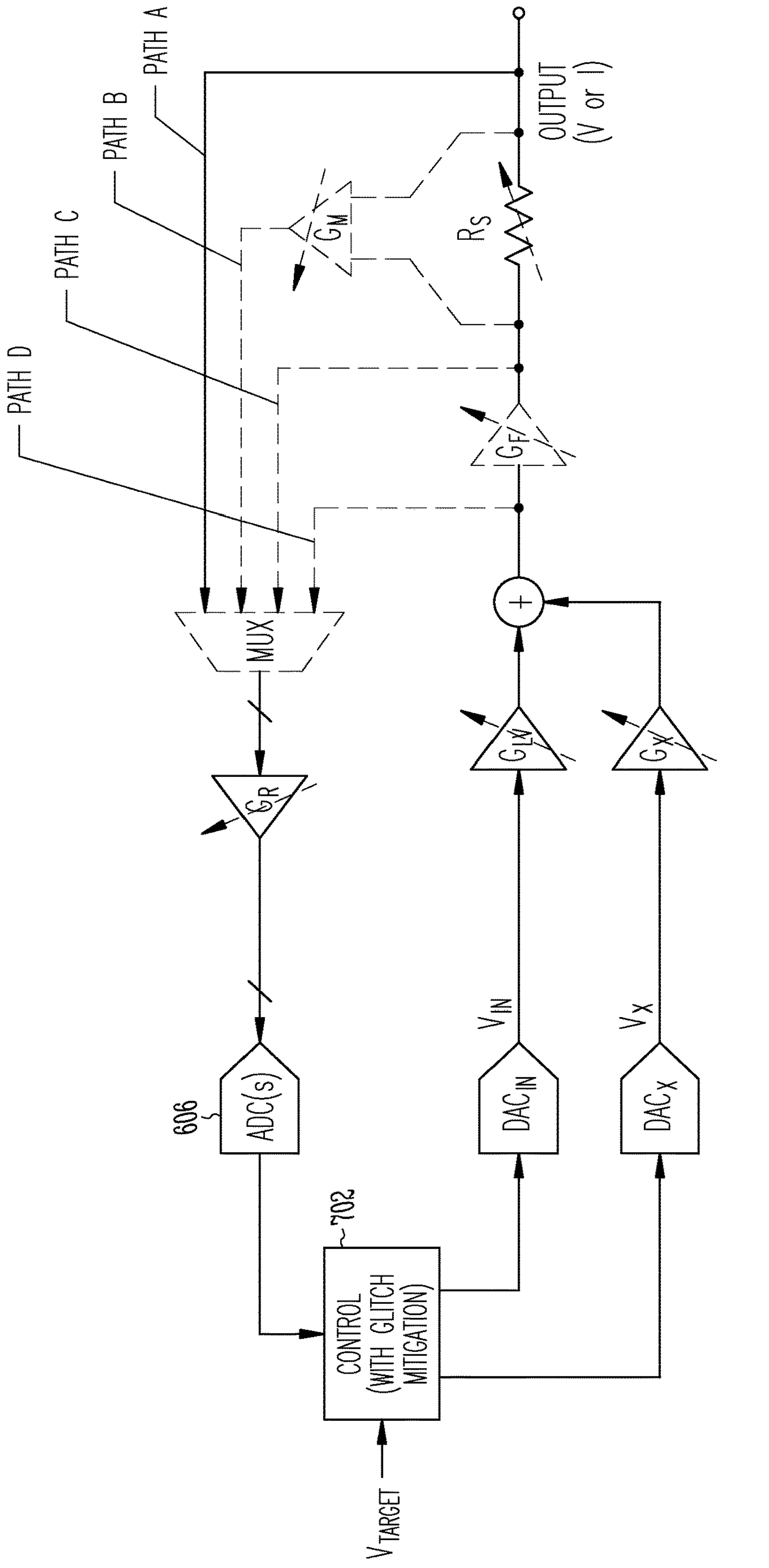
FIG. 7 is a diagram of another example of an electronic circuit that includes an amplifier system having multiple DACs.

FIG. 7 is a circuit schematic of another example of an amplifier system in which the range control switch (SW) has been removed. The action of the switch SW is replaced by suitable control of the DACs by the control circuit 702. For example, when operation is required in the HV low-resolution mode, the control circuit 702 drives the DACs concurrently such that they present equal voltages to the inputs of the $G_{IN}$ amplifier and the $G_X$ amplifier. The composite gain is therefore $G_{LV}+G_X=G_{HV}$. When operation is required in the LV high-resolution mode, the control circuit 702 freezes the $DAC_X$ path at the present operating condition of $V_X$ and proceeds to do any subsequent control exclusively through the $DAC_{IN}$ path, thereby resulting in a gain $G_{LV}$. Because the inputs to the $G_{LV}$ and $G_X$ amplifiers are equal when exclusive control through the $DAC_{IN}$ path begins, any discontinuity or glitch is mitigated during the range switching operation. The reverse range switching (from the LV mode back to the HV mode) is achieved by ramping $DAC_X$ toward the $DAC_{IN}$ while letting the digital feedback continue to servo $DAC_{IN}$ such that $V_{TARGET}$ is maintained at the output. When the contents of $DAC_{IN}$ and $DAC_X$ once again match, any subsequent feedback control from that point forward is achieved by again driving the DACs concurrently so that the $V_X=V_{IN}$ condition is maintained. This effectively returns the system back to the HV range while mitigating any discontinuity, glitch, or aberration at the output.

In the examples of FIGS. 6 and 7, the gain of the feedback path (GR) may be set to scale the output voltage to bring the voltage swing at the input of the ADC 1006 within the limits of the full-scale range for a given ADC. Additionally, the gain (or attenuation) GR may be switched between two or more levels to separately optimize the ADC input range for each of the HV and LV modes. In practice, in the LV mode, the offset introduced by $DAC_X$ may be removed in the return path to further optimize the input range of the ADC 1006. Also, the input of the amplifier with gain GR may be connected to or combined with the input of the amplifier with gain $G_F$.

The closed loop architectures in FIGS. 6 and 7 in which the input voltages (e.g., $V_{IN}$, $V_X$, etc.) are generated using DACs mitigate glitches in the output caused by the change in voltage range between the HV mode and the LV mode. However, glitches in the output may occur from the DACs during the DAC code transitions while the loop is working to maintain steady state near $V_{OUT}=V_{TARGET}$. For example, the control circuit 702 may change the DAC input code by one or two LSBs to adjust the analog output of the DAC to maintain steady state. Changing the digital input may cause a glitch at the analog output. If the amplitudes of the glitches are sufficiently high, the control circuit loop compensation may become cyclic where the compensation of a glitch returns the DAC code to a state in which the glitch is again generated and the compensation repeats. This could cause undesirable ripple at $V_{OUT}$. In power supply applications, output ripple or sustained oscillations at steady state are particularly concerning.

Figure 8:
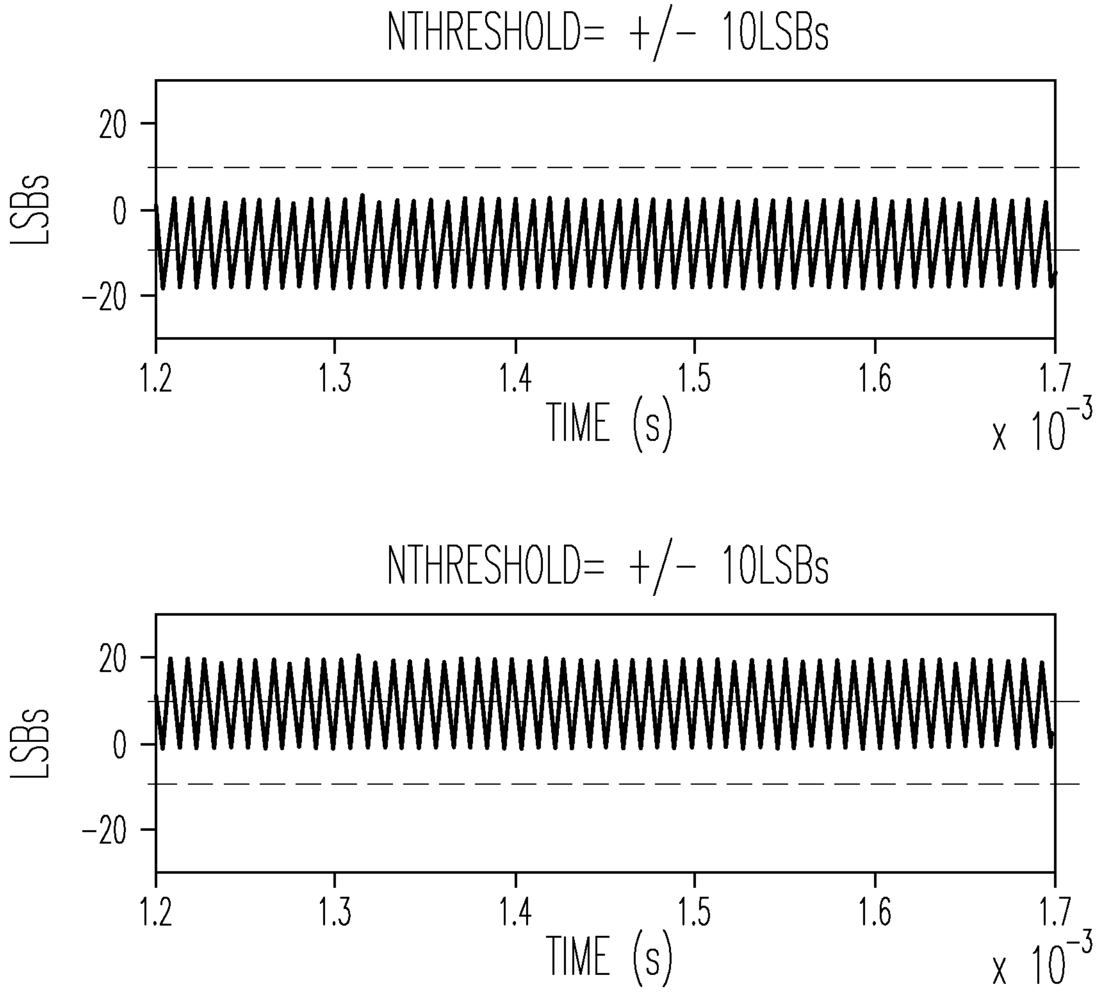
FIG. 8 shows graphs of an example of DAC code transitions.
Figure 9:
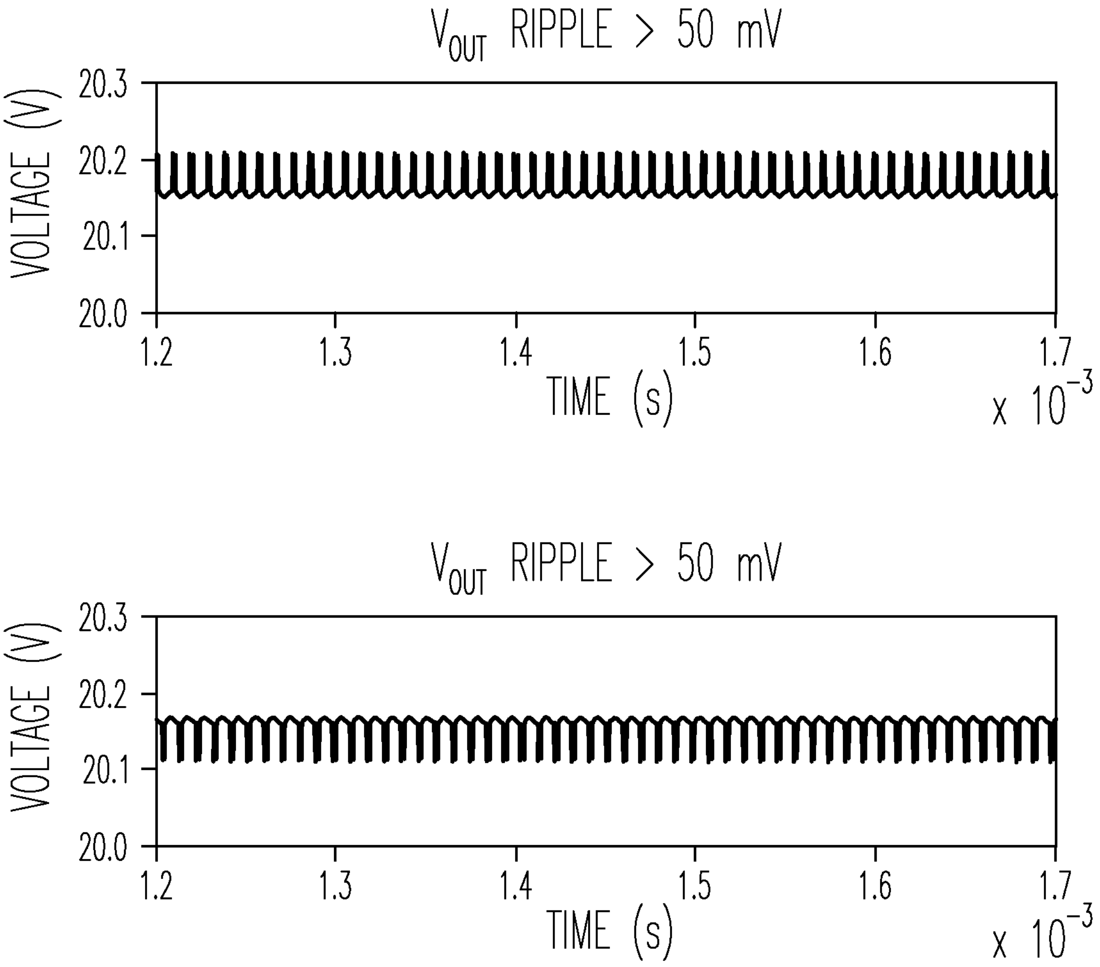
FIG. 9 shows graphs of output ripple that can result from the DAC code transitions of FIG. 8.

FIG. 8 shows graphs of an example of DAC code transitions for a control loop working to maintain steady state near a DAC code region with a relatively large transition (+/−10 LSBs in the example). FIG. 9 shows graphs of the ripple that can result on the output. The control loop is working to settle near 20.15V and the DAC code transitions is causing glitching on the output that causes a 50 mV ripple on the output.

Figure 10:
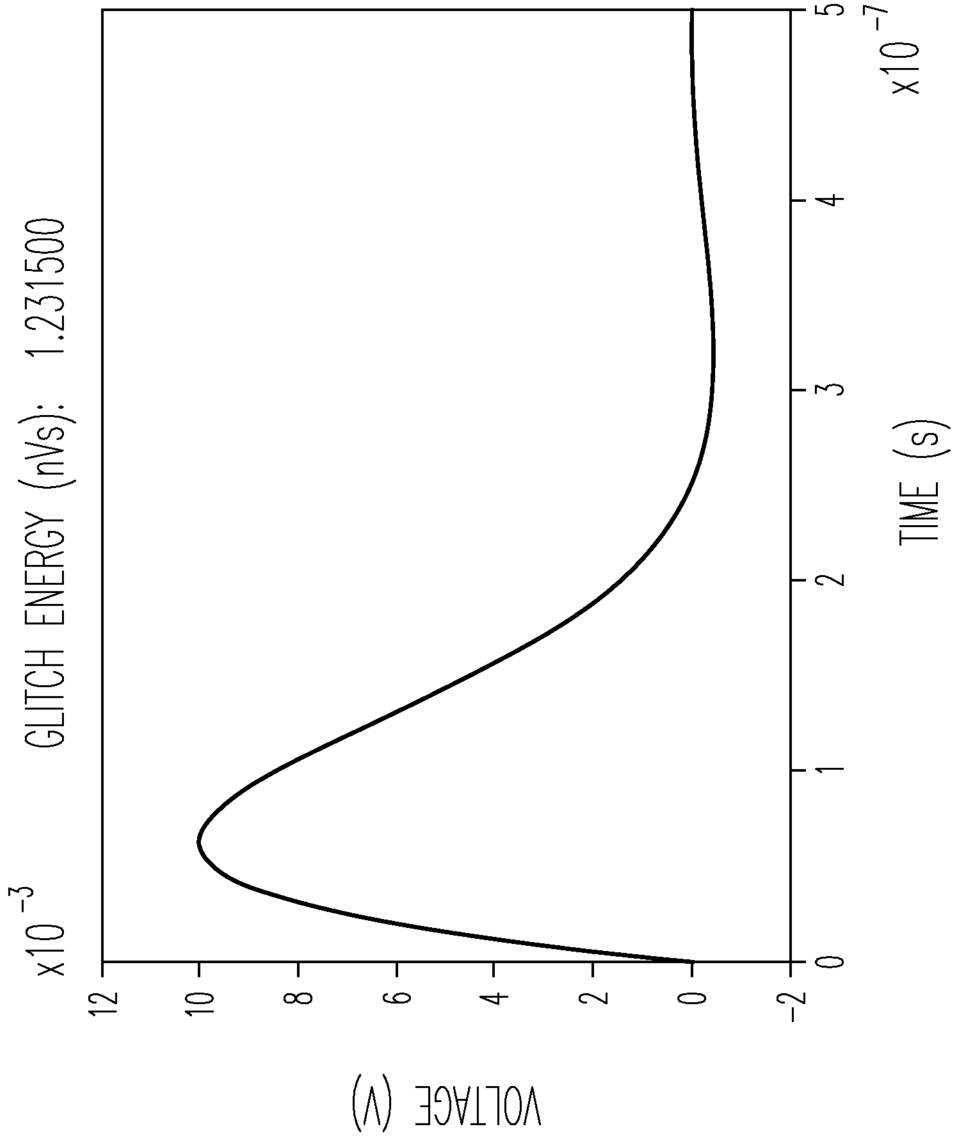
FIG. 10 is an example of a glitch waveform with a 10 millivolt peak amplitude.

The glitch energy of a glitch generated by a DAC can be defined as the net integral area of the worst-case glitch voltage waveform over time minus the endpoint adjusted step transition of the DAC. FIG. 10 is an example of a glitch waveform with a 10 millivolt (10 mV) peak amplitude. The glitch energy of the DAC is dependent on the circuit architecture, micro-architecture, design, and layout of the implementation. A category of DACs known as Nyquist DACs (including unary-weighted, binary-weighted, thermometer-coded, segmented DACs, etc.) require synchronous switching of multiple elements and hence are prone to generation of undesired glitches on the analog output. For instance, binary-weighted DACs utilize an array of capacitors or resistors which are switched between two reference levels. Clock skews between the respective logic circuitry of different array elements result in imperfect switching and cause glitches during transitions. Care should be taken in the circuit and layout design to reduce such imperfections. Binary-weighted DACs may exhibit higher glitch energy than other DAC architectures (e.g., unary scaled architectures). The glitches are generally more severe at Most Significant Bit (MSB) transitions where all the bits are switching. The glitches generated during major carry transitions could result in amplitudes exceeding several Least Significant Bits (LSBs) even though the glitches generated during any other DAC code transitions are benign.

Segmented DACs are implemented as a combination of multiple DAC architectures to obtain better linearity characteristics. Segmented DACs, which usually include both binary-weighted (LSB) and unary-weighted (MSB) segments, also require synchronous switching of multiple branches, and hence are also prone to glitches usually especially during MSB segment transitions. In segmented DACs, the high-energy glitches typically repeat periodically across the DAC code range depending on the number of MSB segments present.

Figure 11:
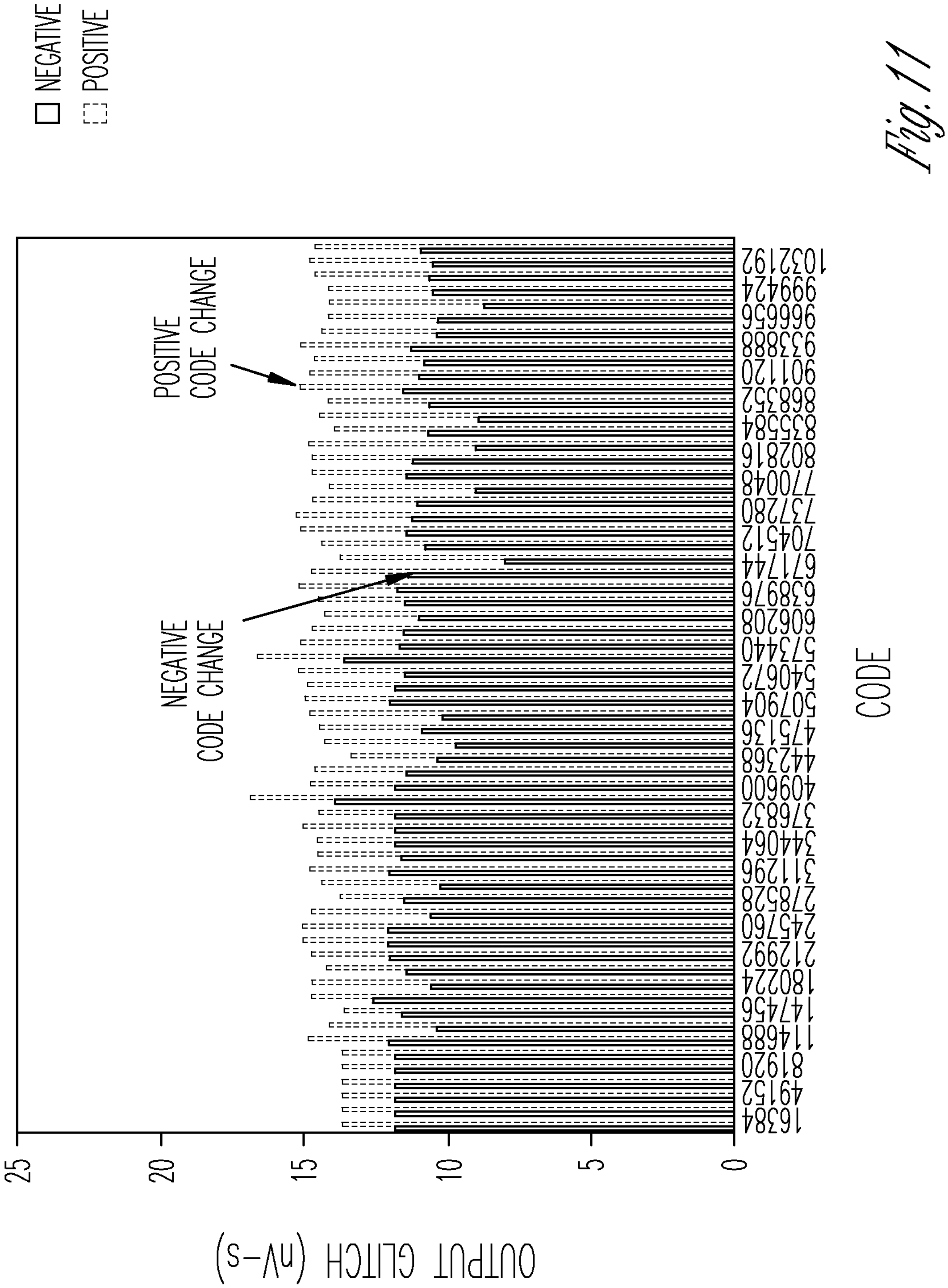
FIG. 11 is a graph of an example of output voltage glitch amplitude versus DAC code changes for a segmented DAC.

FIG. 11 is a plot of an example of output voltage glitch amplitude versus DAC code changes for an 18-bit segmented DAC. The plot shows 64 high-energy glitch spikes present across the DAC code space that correspond to MSB segment code transitions. Also, there can be higher glitch spikes observed at other DAC code transitions in other parts of the DAC code range, e.g., during midscale code transition in the LSB sub-DACs of the segmented DACs. This glitching is dependent on the DAC circuit architecture and micro-architecture details.

Figure 12:
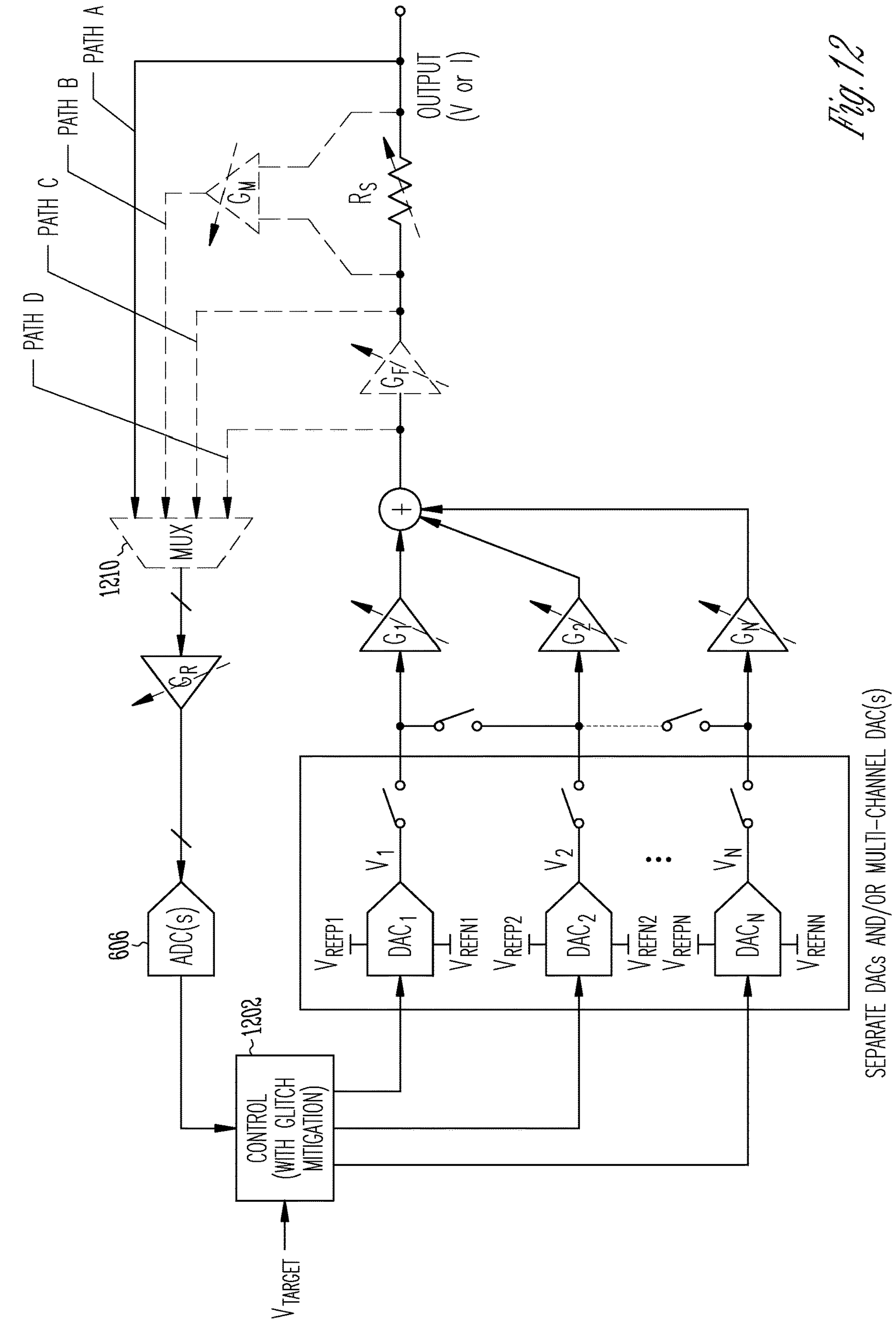
FIG. 12 is an expanded version of the closed loop amplifier system of FIG. 10 with multiple DACs.

FIG. 12 is an expanded version of the closed loop amplifier system of FIG. 6 with multiple DACs or multiple DAC channels. The system of FIG. 12 shows one ADC 606 that can optionally be used to monitor output voltage and output current using any of circuit paths A-D depending on the state of multiplexer (MUX) 1210. In some examples, the system includes multiple ADCs and the MUX 1210 is positioned at the output of the ADCs. The MUX 1210 selects which ADC output to feedback to the control circuit 1202. In certain examples, both current and voltage information can be processed concurrently, or current and voltage from all four circuit paths A-D can be processed concurrently. Some circuit paths may be included in the control circuit loop and some circuit paths may be monitored for other purposes such as fault detection. The DACs can be combined with switches to form a multi-DAC system with DACs connected in parallel, series, or a hybrid of parallel and series connections.

Figure 13:
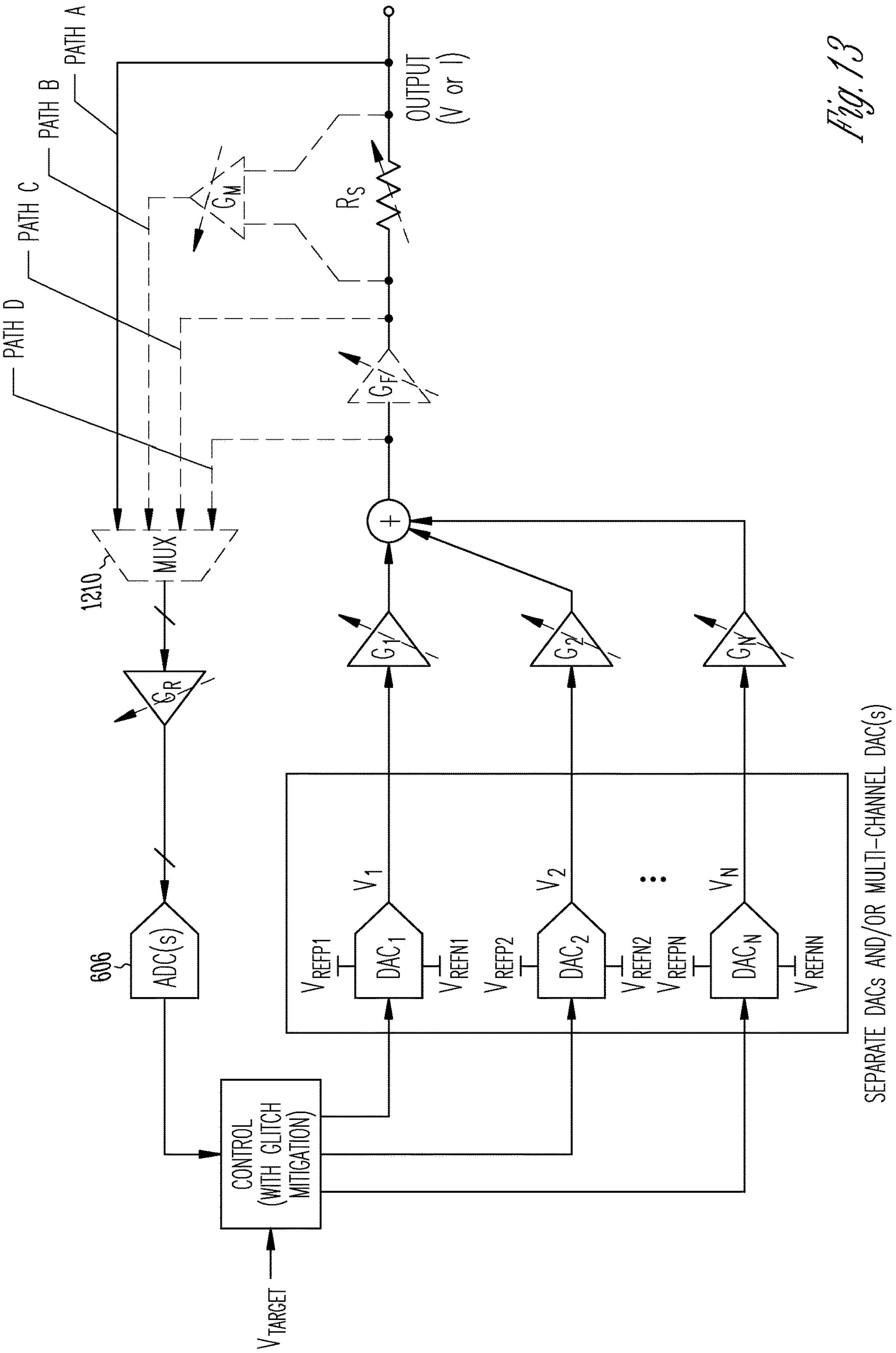
FIG. 13 is the switchless version of the multi-DAC system of FIG. 12.

FIG. 13 is the switchless version of the multi-DAC system of FIG. 12. In these multi-DAC multi-amplifier systems, the voltage (or current) range of each DAC channel path is based on the range of the DAC in each channel and the gains of the subsequent amplification stages. In FIGS. 12 and 13, the high and low reference levels for each DAC ($V_{REFPi}$, $V_{REFNi}$) determine the range of the DAC. These reference levels are voltages that may be fixed or programmable (e.g., using an additional DAC or DACs). The reference voltages may also be provided using a gain or attenuation network.

Figure 14:
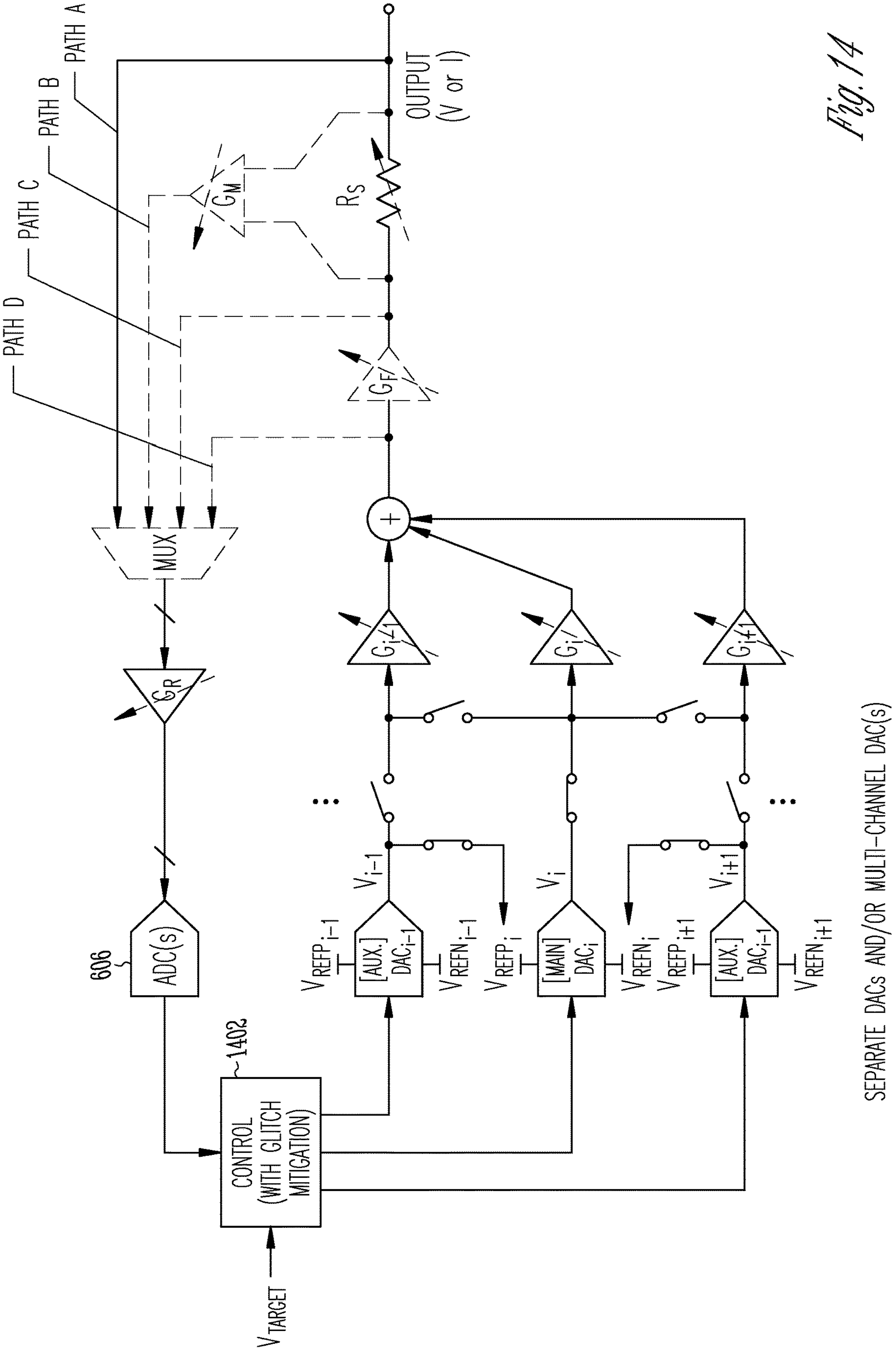
FIG. 14 is a closed loop circuit in which one or more auxiliary DACs are be used to generate the reference levels of main DACs.

FIG. 14 is the closed loop circuit of FIG. 12 in which one or more auxiliary DACs are be used to generate the reference levels of main DACs. In the case of current-mode DACs, the feedback ADC may be the differential ADC 608 that measures current by monitoring the terminals of the sense impedance $R_S$.

In the multi-DAC systems of FIGS. 12-14, different DAC channels with different gains ($G_i$) or reference levels ($V_{REFPi}$) could be made to have fully or partially overlapping transfer curves. Consequently, the mapping from DAC codes to the output voltage (or output current) could be intentionally made to be many-to-one. In other words, there would be multiple different combinations of DAC codes that result in the exact same output voltage (or current) at steady state. Consequently, for each target output level (voltage or current), the control circuit can determine a combination of DAC codes that are sufficiently far away from high-glitch code transitions. The DAC codes may be determined based on a closed-form solution, iteratively or algorithmically. Depending on the range and resolution requirements, the control circuit 1402 may continuously update one or more of the DACs concurrently (e.g., main DACs) while keeping other DAC codes fixed (e.g., auxiliary DACs).

If the glitch energy characteristics of a DAC (e.g., a main DAC) for all different code transitions are known a priori from previous measurements, then the DAC codes could be stored with their glitch characteristics in memory. Because the control circuit knows the current steady state of the amplifier system, the control circuit can avoid loading DAC codes with high-glitch code transitions near the steady state. Some examples of this glitch characteristic data include glitch magnitude (e.g., peak to peak magnitude), positive glitching magnitude, negative glitching magnitude, total or net glitch energy, positive glitch energy, negative glitch energy. A system's response may be optimized using a combination of these metrics. This glitch characteristic data may also be transformed or compressed to reduce memory requirements and reduce the data processing time or power in loading the appropriate DAC codes.

This many-to-one DAC code approach can also be used to avoid glitches at for a "black box" DAC in which the high-glitch code transitions may not be known or the characteristic glitch data may not be available. For example, the magnitude and sign of the DAC code corrections applied by the control circuit may be monitored while the control loop of the amplifier system is trying to settle the output at or near the steady state target. As the control loop reaches steady state near $V_{OUT} \approx V_{TARGET}$, under normal conditions, the control circuit may update the $DAC_{IN}$ code with small increments or decrements (e.g., one or two LSBs) to compensate for gradual changes e.g., due to noise, drift, etc. If loading a new set of DAC codes does not result in a reduction in glitch energy at the DAC analog output, another set of DAC codes can be loaded (e.g., from memory) and the glitch energy at the DAC analog output can be rechecked.

This monitoring may be performed in the digital domain (or software domain) and may be performed using the control circuit as part of a code-adjusting algorithm, or the monitoring may be performed using a separate monitoring circuit included in an ASIC, FPGA, microcontroller, or a processor (e.g., a microprocessor). A high glitch flag signal can be raised in the digital domain when a code update is detected that updates more than a predetermined threshold (e.g., threshold number $N_{THRESHOLD}$ of LSBs) at steady state. For example, in FIG. 8 the high glitch flag signal for a DAC code update of 10 LSBs ($N_{THRESHOLD}$=10 LSBs).

Other methods to detect a high glitch transition condition can be used. In some examples, the analog output of the DAC or the system output can be monitored to detect glitches. A high glitch condition may be detected by glitches that exceed a specified glitch peak threshold (in either volts or amps). In other examples, a high glitch condition can be detected by glitches that exceed a specified glitch energy (e.g., Volt-seconds or Amp-seconds). A high glitch flag signal can be raised when the control circuit detects a high glitch transition that exceeds a specified threshold transition. The high glitch threshold transition may be specified as a number of LSBs or in volts or amps. In some examples, a population-based analysis can be used. Combinations of DAC codes and target values can be tracked. Worst-case combinations can be tracked (e.g., through machine learning) to identify which DAC Code versions are likely to result in a high glitch transition condition for a given target value. The high glitch threshold transition can be adaptive based on the design of the system or machine learning algorithm of the system.

The size of the set of DAC codes which the glitch mitigation can be used for (the sub-population to be mitigated) is limited by the redundancy or contingency built into the design to enable avoiding of code(s). Hence, whilst the analysis can identify codes to be mitigated against, usually the worst-case codes, the DAC design needs to ensure there's sufficient contingency in place to address the anticipated worst case needs. In some applications, there may be particular codes or code region(s) of the transfer function which are more important in the final use case and hence glitch mitigation may be prioritized from such region(s) as part of this foresaid analysis.

When a high-glitch flag is raised, the code or codes for the DACs may be changed to a different code or codes where the steady state DAC code or codes are sufficiently far away from a high glitch transition so that a high glitch does not occur in steady state. This predetermined threshold $N_{THRESHOLD}$ to cause a code update may be varied. In some examples, when a high-glitch flag is raised, an offset voltage is introduced in the loop such that the control circuit allows the main DAC or DACs in the loop to settle at one or more DAC codes sufficiently far away from the high-glitch transitions. The offset may be introduced at any point in the loop using analog means (e.g., an opamp based adder circuit) or may be introduced to the DAC codes directly in the digital domain. In addition, the reference level of one or more main DACs may be adjusted to create an offset effect or to change gain.

The glitch characteristic data may be stored in memory and may be used to calculate the amount of offset needed for a given high-glitch DAC code transition according to a pre-defined function, optimization, approximation, or machine learning algorithm. The glitch characterization technique may be implemented as foreground calibration when the system is idle or as a background calibration while the system is operational. A foreground calibration may be done during system manufacture. A foreground calibration may also be done by the user (e.g., as part of system reset or a calibration procedure). The amplifier system may adaptively adjust offset amounts as it encounters new high-glitch code transitions during operation. The glitch characterization technique may also be used to respond to a change in load of the amplifier system that results in a new steady state that is near a high glitch transition.

Figure 15:
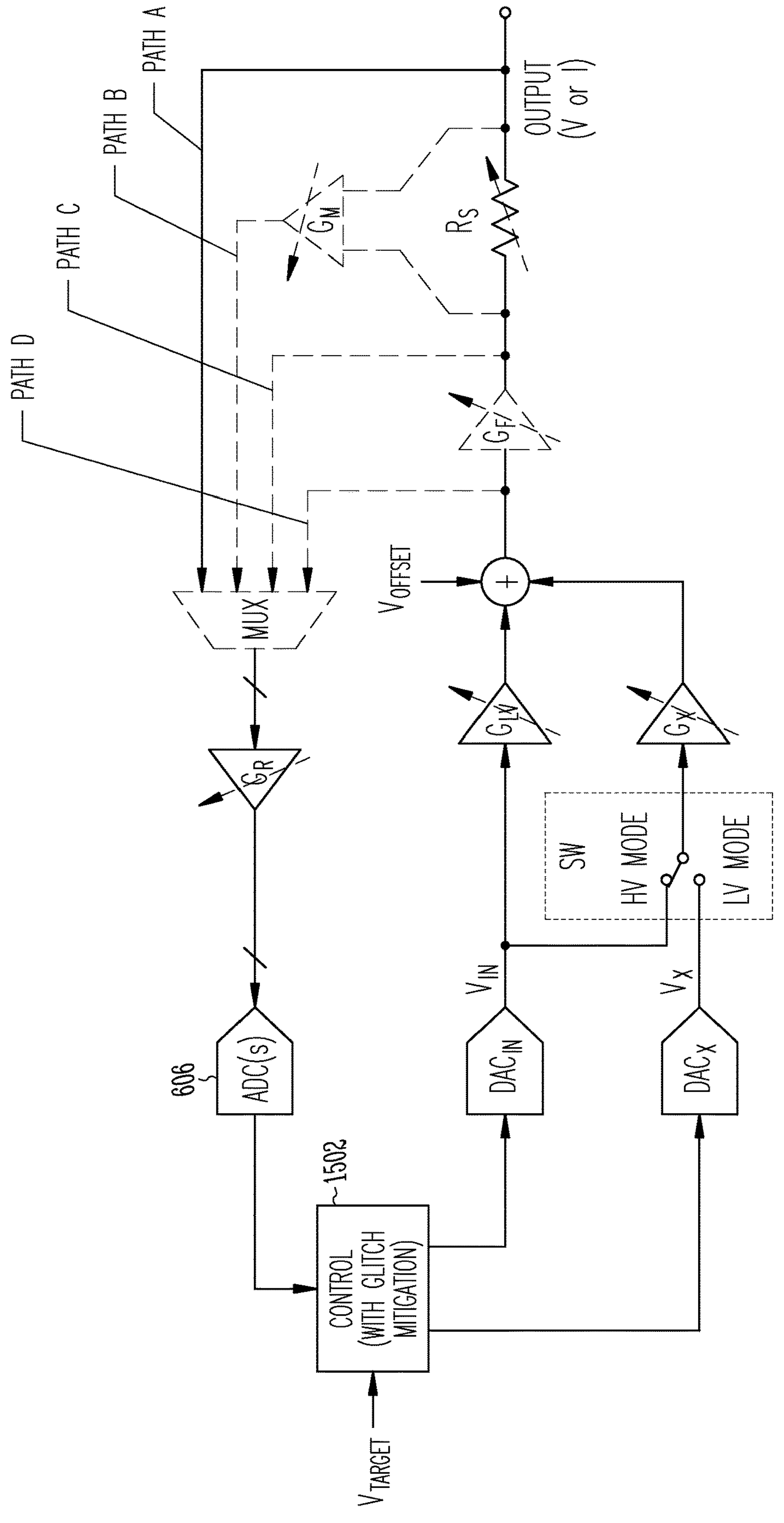
FIG. 15 is a circuit diagram of another example of an amplifier system.

FIG. 15 is a circuit diagram of another example of an amplifier system. The example shows one ADC 606, one main DAC ($DAC_{IN}$), and one auxiliary DAC ($DAC_X$) for simplicity of the diagram. The example of FIG. 15 introduces a voltage offset $V_{OFFSET}$ to the control loop of the two DAC architecture with the range control switch SW of the amplifier system of FIG. 6. ADC 606 may monitor either the output voltage or output current, or two ADCs may be included to monitor both the output voltage and the output current. In the example of FIG. 15, the voltage offset is added to the summation node at the output of the $G_{LV}$ and $G_X$ amplifiers, but the voltage offset can be introduced at any other circuit node within the control loop of the amplifier system. The switch SW changes operation of the system between HV mode and LV mode.

Figure 16:
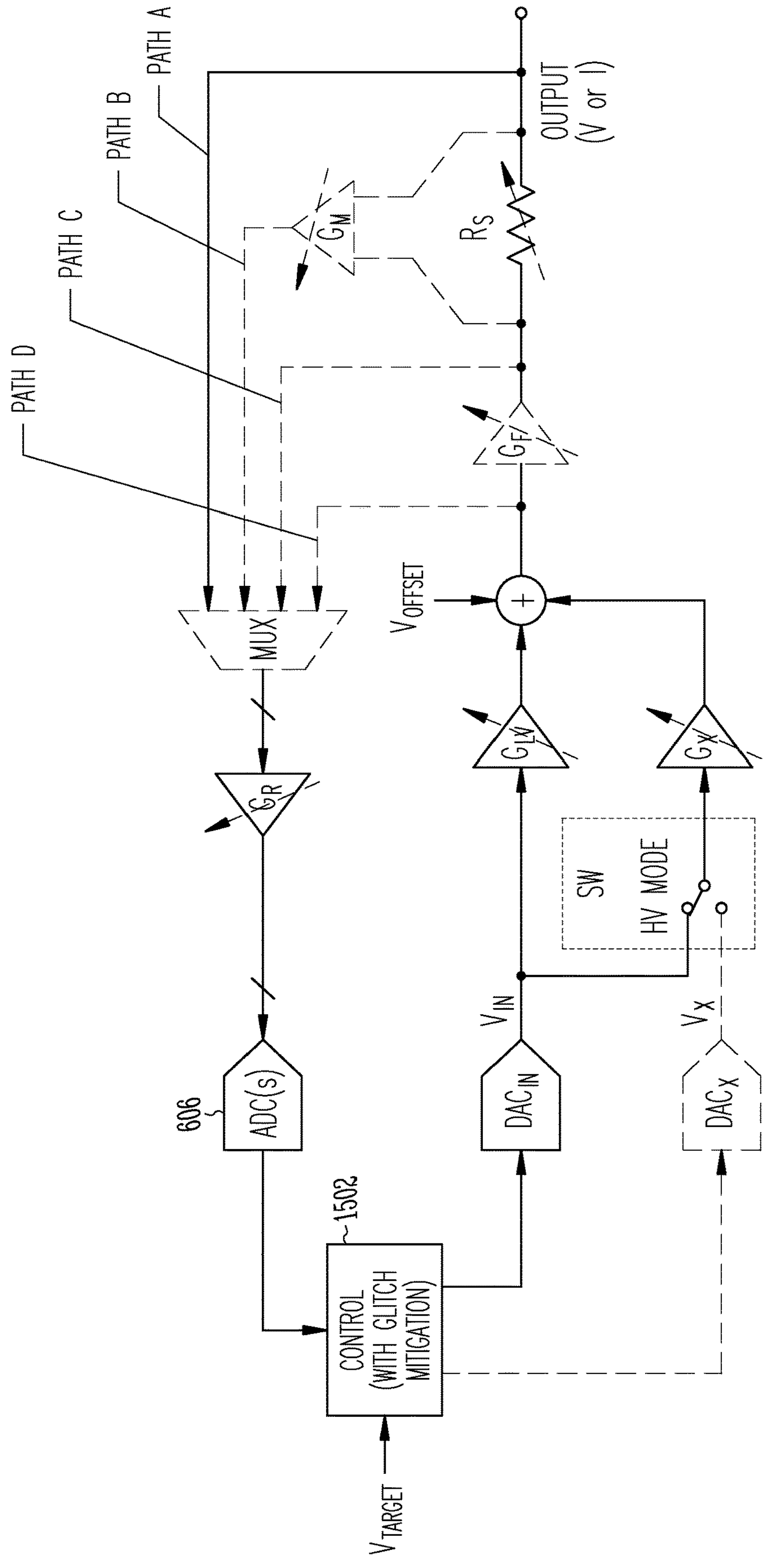
FIG. 16 shows the amplifier system of FIG. 15 operating in the high voltage low-resolution mode.
Figure 17:
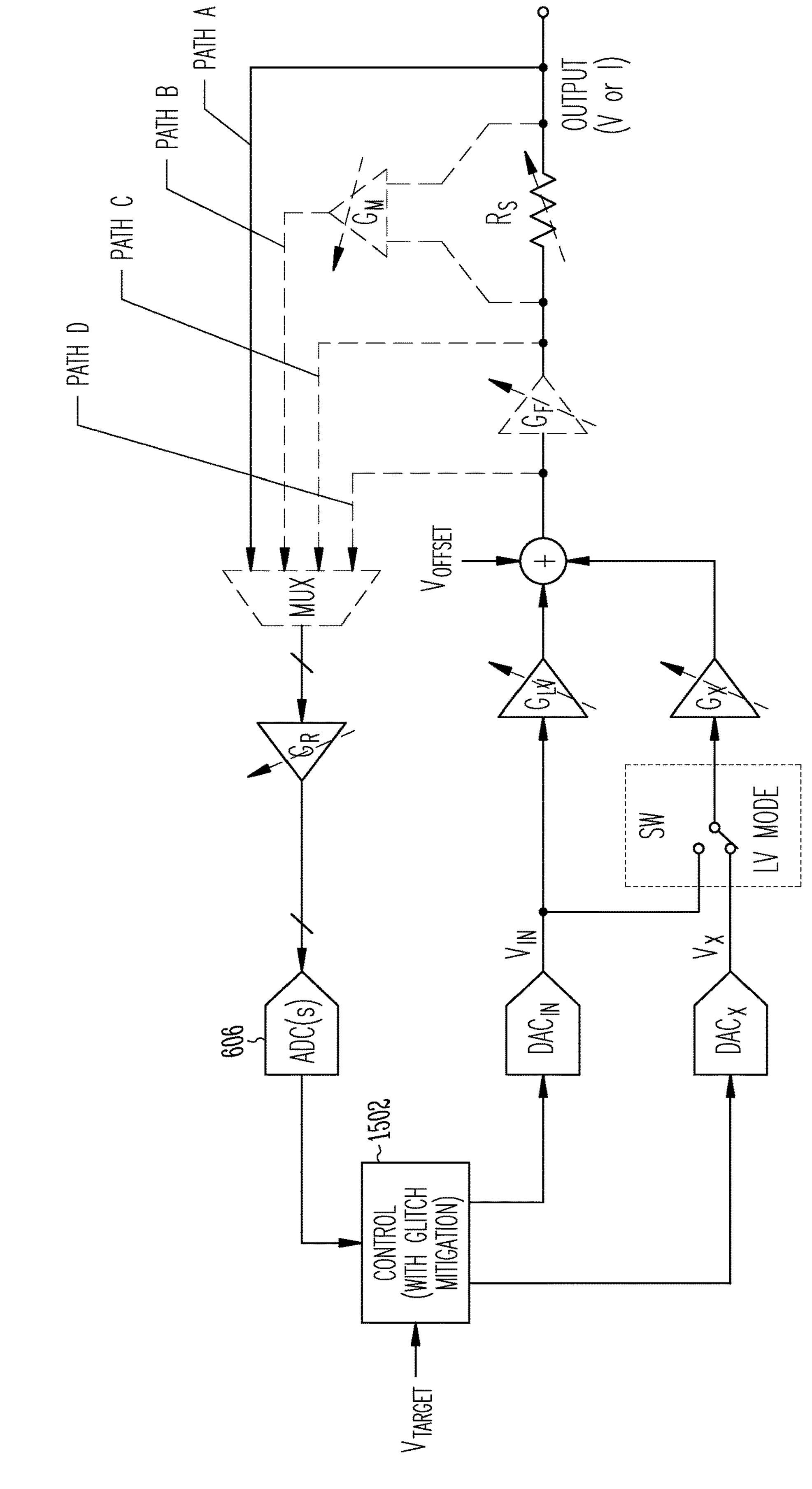
FIG. 17 shows the amplifier system of FIG. 15 operating in the low voltage high-resolution mode.

FIG. 16 shows the amplifier system of FIG. 15 operating in the HV low-resolution mode. During the HV mode, $DAC_X$ becomes redundant, and the amplifier system effectively becomes the single-DAC system as shown in FIG. 16. The voltage offset maybe introduced at any point in the loop or may be introduced digitally to the code of $DAC_{IN}$ by the control circuit 1502. FIG. 17 shows the amplifier system of FIG. 15 operating in the LV high-resolution mode. During the LV mode, the switch SW is in the LV mode position to connect $DAC_X$ to the input of the $G_X$ amplifier, and therefore $DAC_X$ may be used to set the minimum and maximum extent of the LV range.

Figure 18:
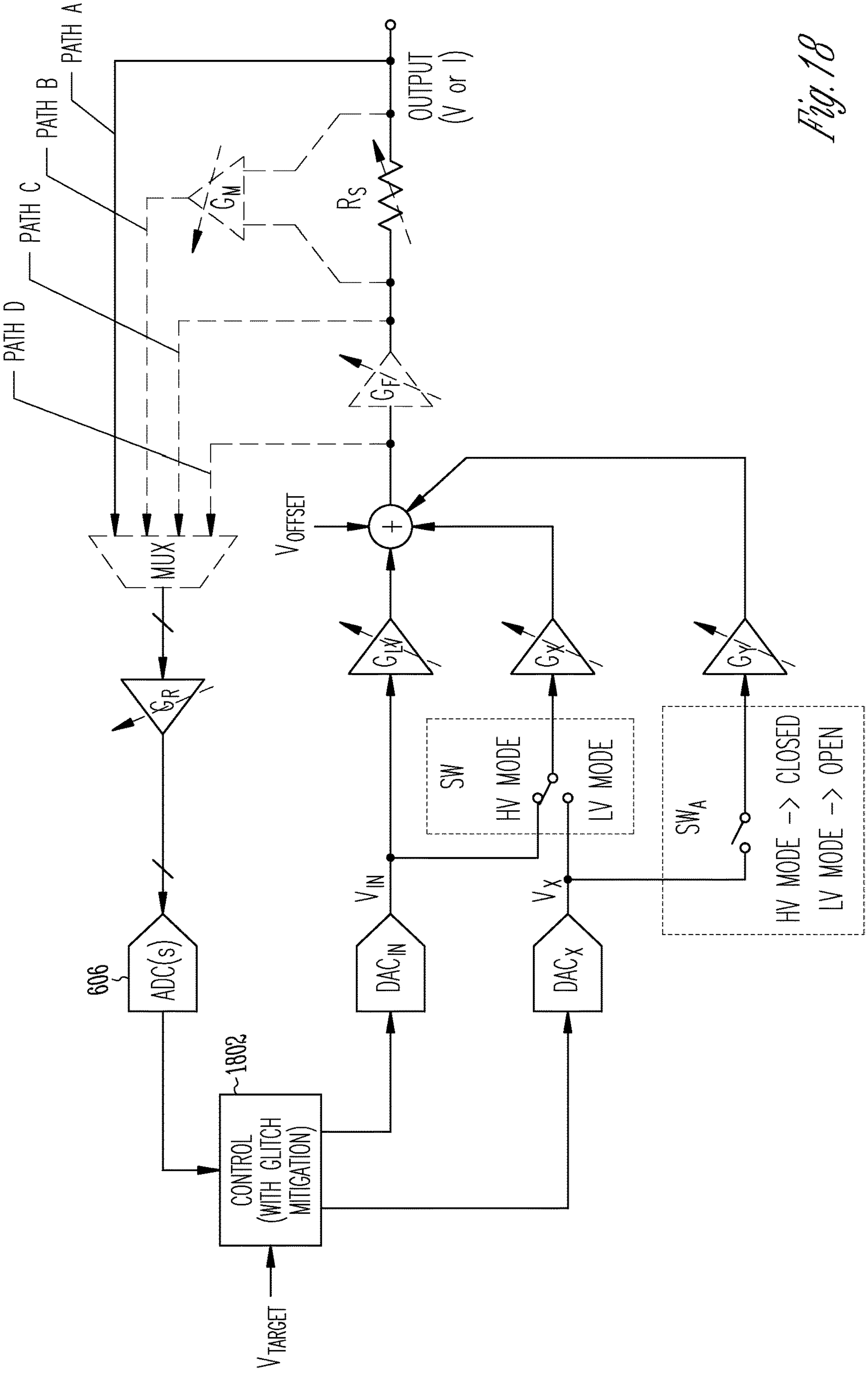
FIG. 18 is a circuit diagram of another example of an amplifier system.

FIG. 18 is a circuit schematic of another example of an amplifier system. In the Example of FIG. 18, another switch $SW_A$ is added at the output of $DAC_X$ to introduce the voltage offset $V_{OFFSET}$ to the summing node at the output of the $G_{LV}$ and $G_X$ amplifiers. Optionally, a gain stage with an amplifier provide gain $G_Y$ may also be included after the switch $SW_A$ depending on the magnitude of the offset that needs to be applied versus the $DAC_X$ full scale range.

Figure 19:
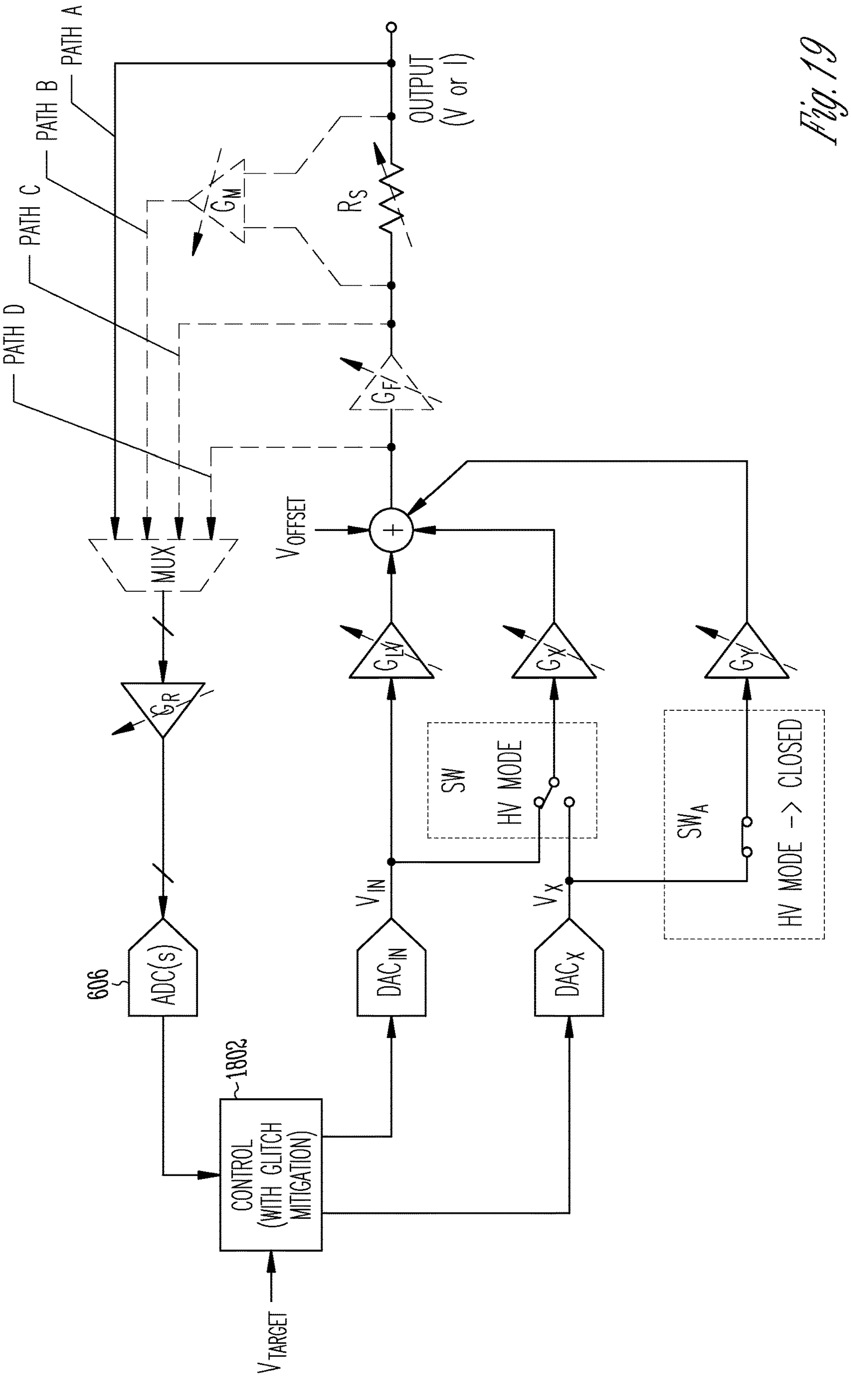
FIG. 19 shows the amplifier system of FIG. 18 operating in the high voltage low-resolution mode.
Figure 20:
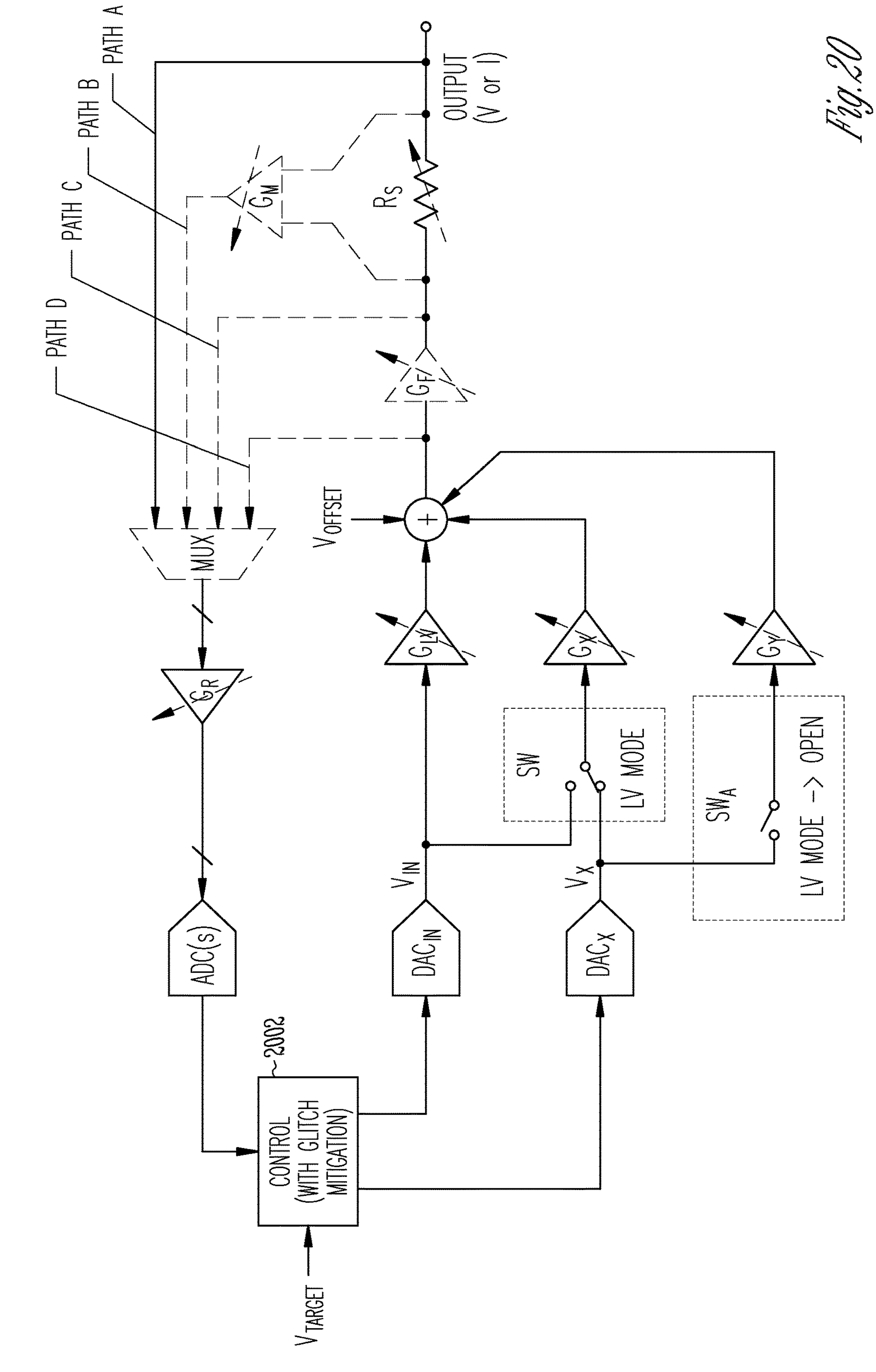
FIG. 20 shows the amplifier system of FIG. 18 operating in the low voltage high-resolution mode.

FIG. 19 shows the amplifier system of FIG. 18 in the HV mode. In the HV mode, switch SW applies $V_{IN}$ to the $G_{LV}$ and $G_X$ amplifiers and the control circuit 1802 closes switch $SW_A$ to apply the output of $V_X$ or $G_Y V_X$ to the summing node. The control circuit 1802 may load a DAC code into $DAC_X$ in the HV mode to generate the value of the offset provided to the summing node. FIG. 20 shows the amplifier system of FIG. 18 in the LV mode. In the LV mode, switch SW applies $V_X$ to the $G_X$ amplifier and switch $SW_A$ is open, and $DAC_X$ is used to set the minimum and maximum extent of the LV range.

Figure 21:
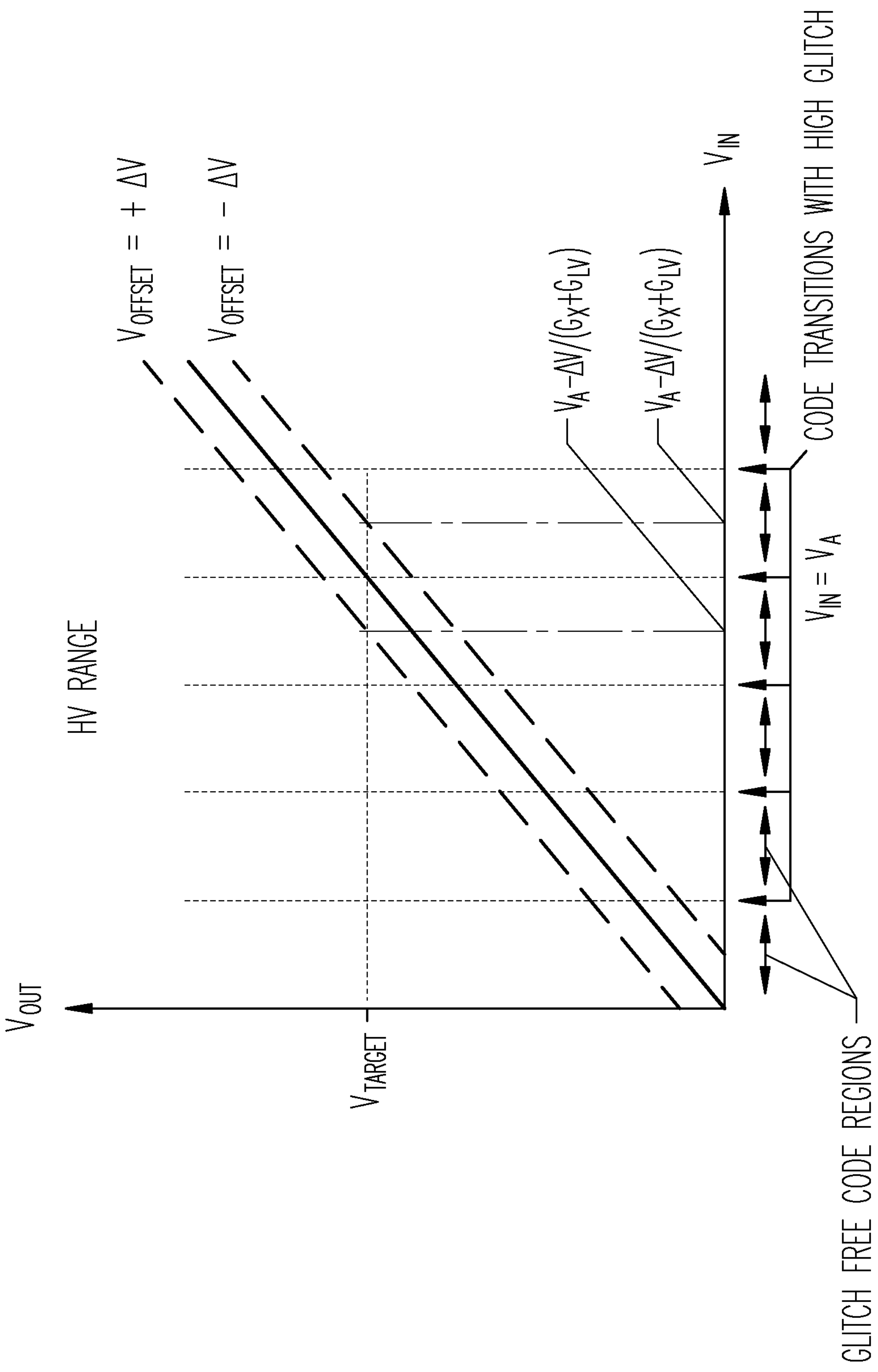
FIG. 21 is a graph of a transfer curve for the amplifier system of FIGS. 16 and 19 operating in the high voltage mode.

FIG. 21 is a graph of the $V_{OUT}$ vs $V_{IN}$ transfer curve for the amplifier system of FIG. 15 operating in the high voltage low resolution (HV) mode. The transfer curve shows that the added offset (±ΔV) has the effect of shifting the $V_{OUT}$ vs $V_{IN}$ transfer curves up and down when the switch SW is in the HV mode. The vertical dashed lines correspond to exemplary $DAC_{IN}$ code transition boundaries that result in a high glitch at the DAC output. In the example of FIG. 21, the control loop of the amplifier system of FIG. 15 is trying to converge to $V_{OUT} \approx V_{TARGET}$ which results in the input $V_{IN} \approx V_A$ at a high-glitch code transition boundary. To avoid this high-glitch DAC code boundary, the system would like to operate at an offset (high or low) HV range that also covers $V_{OUT} \approx V_{TARGET}$ but at a $V_{IN}$ value that is not near a DAC high glitch boundary.

Figure 22:
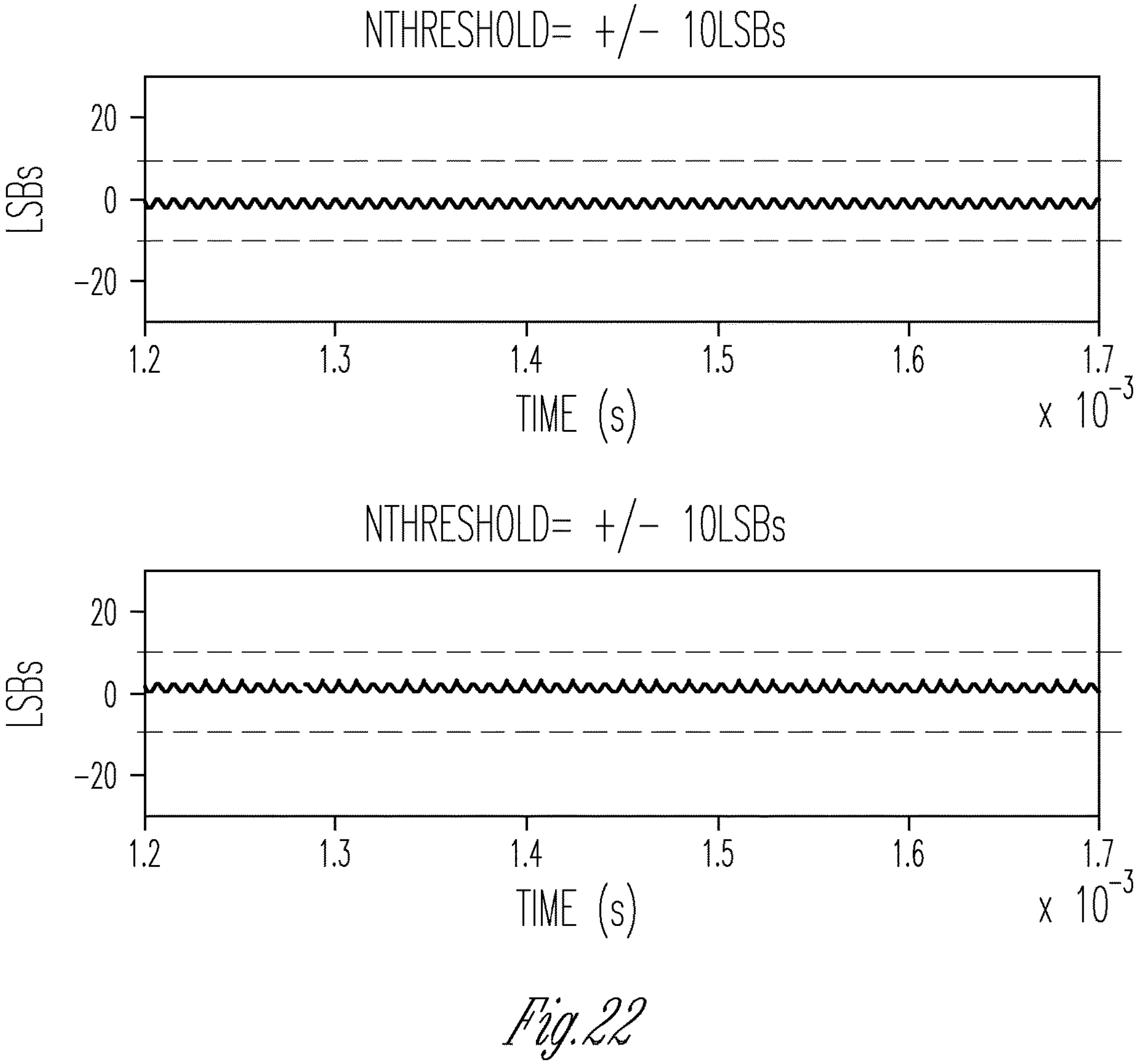
FIGS. 22 and 23 are graphs showing the circuit of FIGS. 15 and 16 operating in a DAC code region with relatively low glitching.
Figure 23:
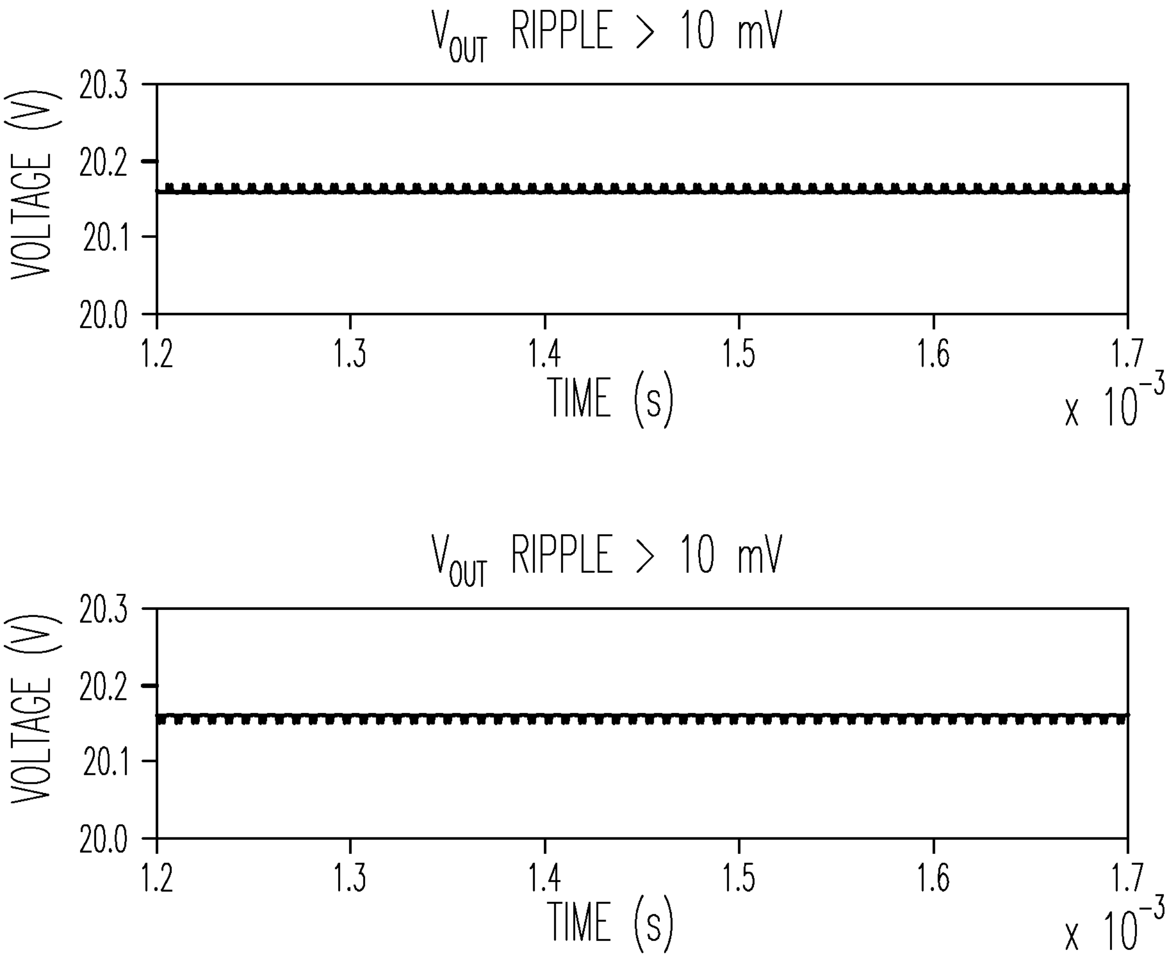

For instance, if $V_{OFFSET}=+\Delta V$ is applied, the transfer function shifts to the upper $V_{OFFSET}=+\Delta V$ line. The control loop will reduce the value of $$V_{IN} \text{ to } \left(V_A - \frac{\Delta V}{G_X + G_{LV}}\right)$$

to maintain $V_{OUT} \approx V_{TARGET}$. As shown in FIG. 21, the offset causes the control loop to shift to a glitch-free DAC code region corresponding to the lower value of $V_{IN}$, and the loop will converge with a main DAC ($DAC_{IN}$) code away from a high-glitch transition in the code space. FIGS. 22 and 23 show the results of shifting to the new DAC code region. FIG. 22 shows that the DAC code transitions are less than $N_{THRESHOLD}$ of FIG. 8 and FIG. 23 shows that the output ripple is reduced from FIG. 9. The output voltage at steady state with the offset will have significantly reduced glitch and ripple than at steady state without the offset.

Figure 24:
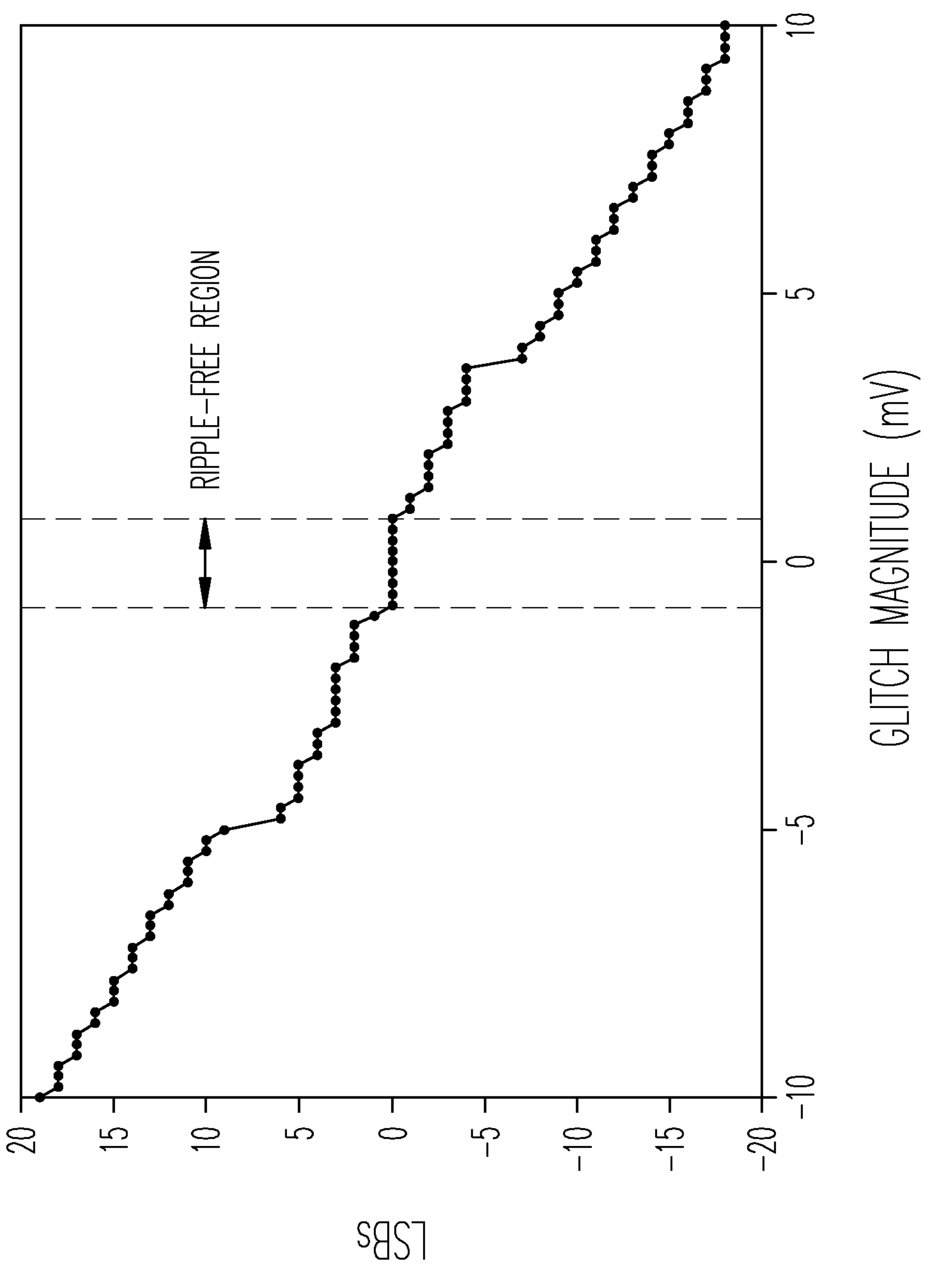
FIG. 24 is a plot of an example of peak code transition at steady state versus glitch magnitude of the transitions.

FIG. 24 is a plot of an example of peak code transition (in LSBs) at steady state versus glitch magnitude of the code transitions. The plot shows that the relationship between signed glitch magnitude and code transition is substantially linear. The plot also shows that the DAC code update needed is inversely proportional to the signed glitch magnitude. At the system level, when a high-glitch flag is raised, this glitch energy characteristic information regarding glitch sign and magnitude may be recorded in memory (e.g., using the control circuit or separate monitoring circuit) and may be used to determine an appropriate amount of offset to achieve a given code transition.

The peak amplitude of the glitches is relevant in closed loop applications as the glitching can show up directly as a glitch waveform or ripple at the output ($V_{OUT}$) in accordance with the frequency response of the control loop of the amplifier system. In addition, if the glitch waveform at the output is sampled by the ADC, it may also cause instability in the control loop and cause additional undesirable ringing or oscillatory response at the output.

As noted previously herein, the glitch energy can be defined as the net integral area of the glitch waveform. In some applications, depending on the aperture window of the feedback ADC, the glitch energy may be more critical in terms of the response of the control circuit than the glitch peak magnitude. In other words, the control circuit may not respond significantly to a glitch waveform with low energy but high magnitude (e.g., a narrow glitch) if the ADC has a sufficiently wide aperture window due to the averaging effect. Consequently, depending on the system, it may be favorable to reduce glitch magnitude, glitch energy or both for a given application. An advantage of the glitch self-characterization and calibration techniques described herein is that the DAC code updates that are used for characterization rely on the response to DAC glitches of the ADC (e.g., the ADC 606 of FIG. 15) in the closed loop control and therefore removes the dependency on the exact shape of the glitch waveform.

FIG. 24 shows that when the DAC glitch magnitude is further reduced (e.g., to less than ±1 mV peak within the vertical dashed lines), the amount of code update required to keep $V_{OUT} \approx V_{TARGET}$ becomes less than 1 LSB and the control circuit keeps the code constant. Consequently, $V_{OUT}$ becomes substantially free of ripples due to DAC code updates even though the loop is trying to settle near a code transition with a given glitch energy if the glitch energy at the transition is less than a threshold. The threshold glitch magnitude or glitch energy may depend on the shape of the glitch waveform, system parameters, and the dynamics of the control loop.

Figure 25:
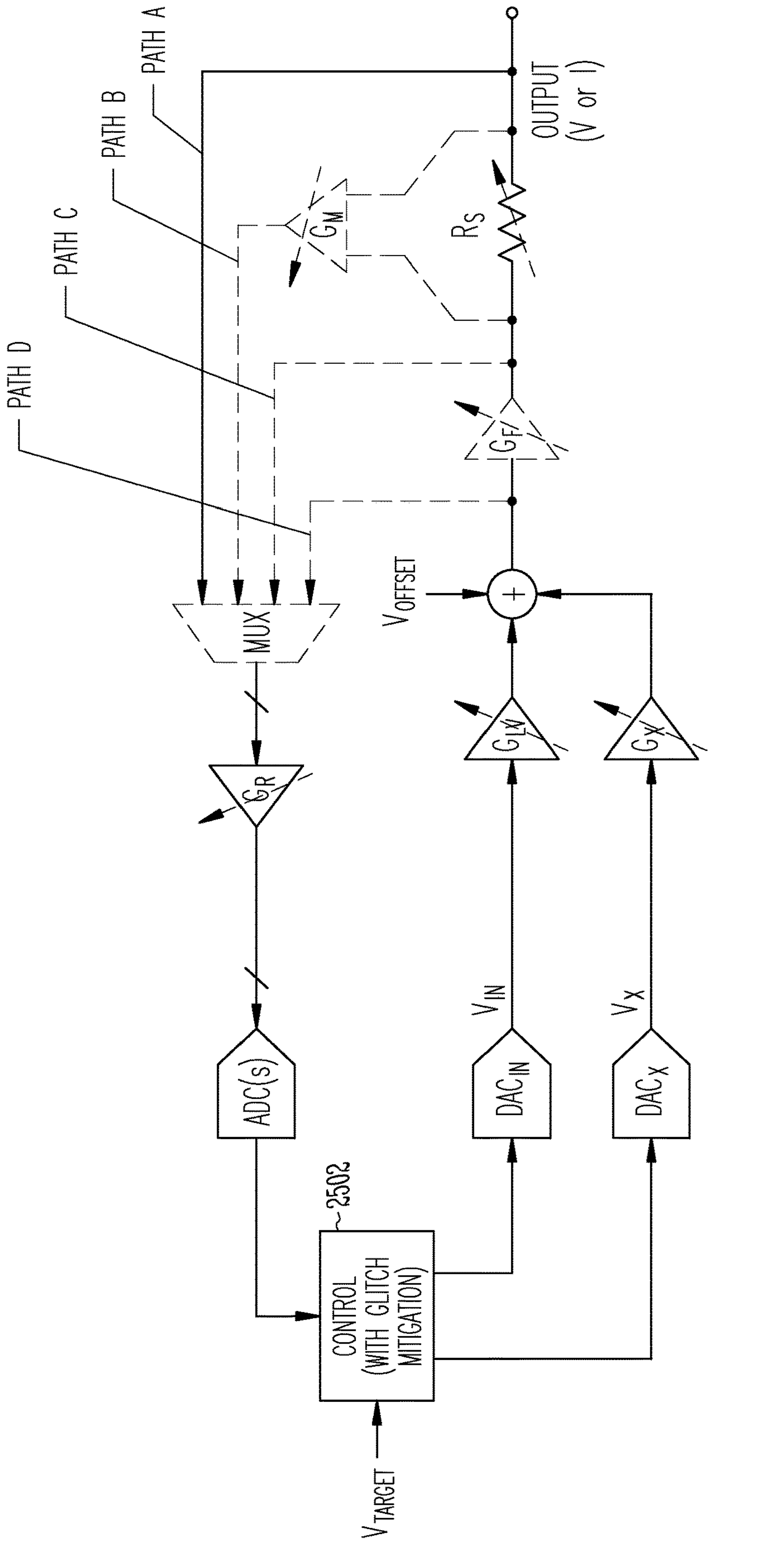
FIG. 25 is a diagram of another example of an electronic circuit that includes an amplifier system having multiple DACs.

FIG. 25 is a circuit schematic of another example of an amplifier system. The example of FIG. 25 introduces a voltage offset $V_{OFFSET}$ to the control loop of the two DAC architecture without the range control switch SW of the amplifier system of FIG. 15. During the HV mode, the control circuit 2502 drives both $DAC_{IN}$ and $DAC_X$ concurrently so that the effective total gain becomes $G_{LV}+G_X\ G_{HV}$. In an example embodiment, for a given $V_{TARGET}$, the control loop may be trying to settle near a code transition that is known to generate high energy glitches in one, or both, of $DAC_{IN}$ and $DAC_X$. Alternatively, if the glitch profile of the code transitions is unknown, a glitch event can be detected at the system level as in the block box example described previously herein. In either scenario, if a $V_{TARGET}$ value corresponds to a high-glitch code boundary, the control circuit 2502 could introduce an arbitrary offset in the DAC codes while keeping $V_{OUT} \approx V_{TARGET}$.

For instance, the $DAC_X$ code could be incremented to force $V_X$ to increase by offset $\Delta V_X$ and $DAC_{IN}$ code could be decremented to force $V_{IN}$ to decrease by $\Delta V_X{*}G_X/G_{LV}$ such that $V_{OUT}=G_X{*}V_X+G_{LV}{*}V_{IN}$ is maintained. The amount of offset may be controlled (e.g., using another DAC to add an adjustable offset ($V_{OFFSET}$) to the summing node). Also, the offset value could be increased gradually, or using successive-approximation or other more complex search algorithms, until both DACs are comfortably in the glitch-free code space. After the offset in code space is introduced between the two DACs, the control circuit 2502 would allow the control loop to control both DACs while maintaining the fixed offset. In this way, both DACs will settle at a code region that is far away from the high-glitch boundaries to minimize ripple in the output. When the system receives an update to $V_{TARGET}$ the control circuit 2502 may bring the DAC codes together first before letting the loop settle to the new target $V_{OUT}$ value.

Regarding the LV high-resolution mode operation of the amplifier system of FIG. 15 shown in FIG. 17, the range switch SW connects the output of auxiliary $DAC_X$ to the input of the $G_X$ amplifier and connects the output of the main $DAC_{IN}$ to the $G_{LV}$ amplifier. Consequently, the amplifier systems of FIGS. 15 and 25 may become practically identical in the LV high-resolution mode.

As described previously herein regarding the amplifier system of FIG. 15, the input of $DAC_X$ is frozen and the control circuit 1502 updates the DAC code of $DAC_{IN}$ while trying to maintain $V_{OUT} \approx V_{TARGET}$ at steady state. If the steady state input of $DAC_{IN}$ happens to be near a DAC code where there is a high-glitch boundary, then the control circuit may perform the cyclic compensation described previously herein and cause undesirable ripples at the output. The same is true for the amplifier system of FIG. 25.

For the system architectures of FIGS. 15, 18, and 25 that have multiple DACs, the steady state $V_{OUT} \approx V_{TARGET}$ condition can be satisfied with multiple points in DAC code space assuming that auxiliary DAC ($DAC_X$ in the examples) has sufficient resolution. If a high-glitch steady-state condition is detected, then the DAC code or codes can be moved to another DAC code value that is sufficiently far away from the high-glitch DAC code boundary to minimize ripple on the output due to DAC code transitions.

Figure 26:
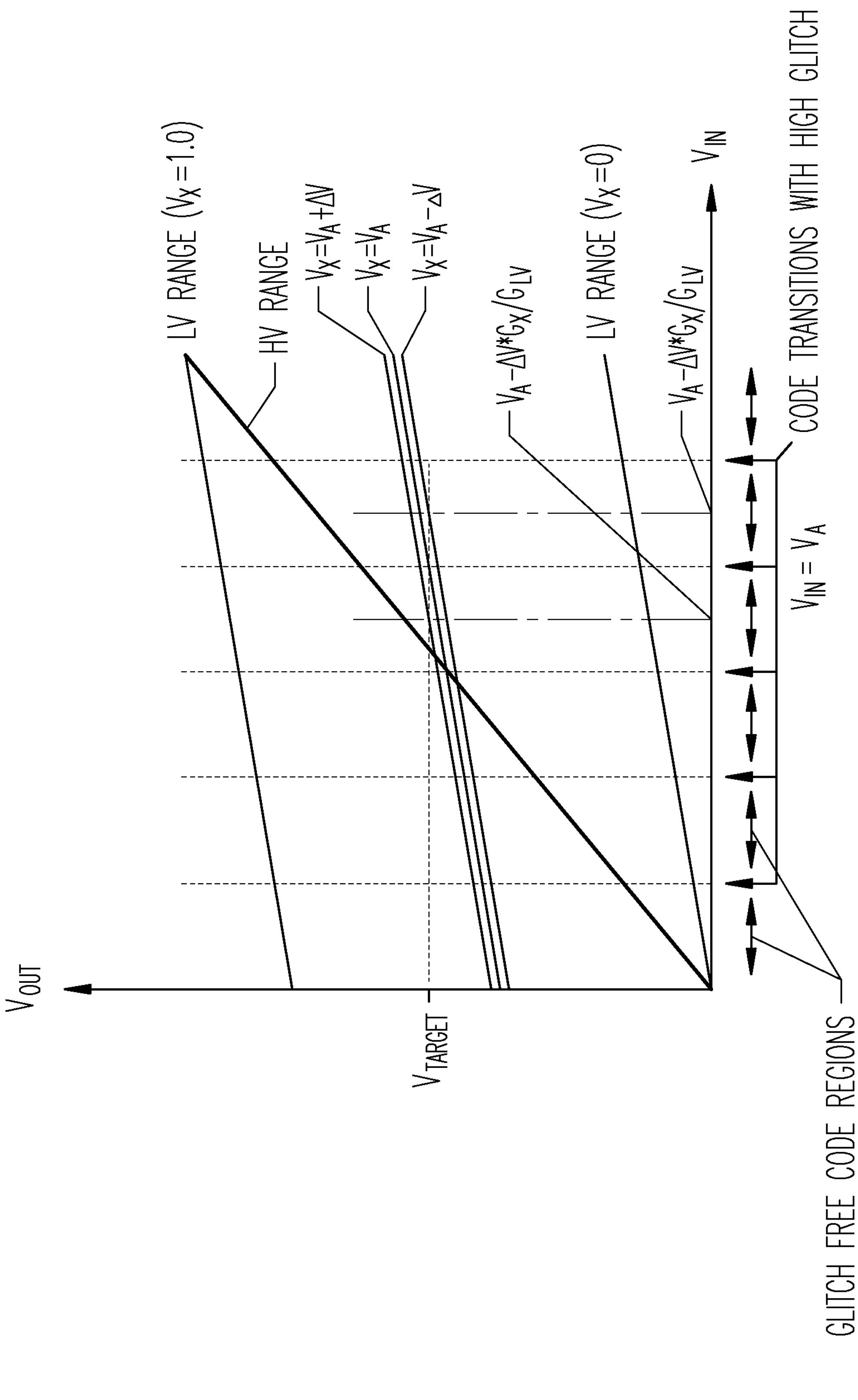
FIG. 26 is an illustration of an example of a transfer function for the circuits of FIGS. 17, 20, and 25 operating in the low voltage mode.

FIG. 26 is a graph of the $V_{OUT}$ vs $V_{IN}$ transfer curve for the amplifier systems of FIGS. 15 and 25 for different $V_{IN}$ and $V_X$ values in the low voltage high resolution (LV) mode. The vertical dashed lines illustrate $DAC_{IN}$ code transition points with high glitch. The regions between the vertical dashed lines are glitch-free. Assume the loop is trying to converge near the point $V_{IN}=V_A$ which happens to be near a high-glitch boundary. The amplifier system may infer that the convergence point is near a high-glitch code boundary by observing the DAC codes. To avoid this high-glitch condition, the amplifier system should operate at an LV range that also covers $V_{OUT}=V_{TARGET}$ but at a $V_{IN}$ value that is not near a high-glitch code boundary.

The multiple DAC architectures in the examples of FIGS. 15 and 25 enables the shifting of the LV Range transfer curve up and down by incrementing the $DAC_X$ code up and down or by adding the offset (±ΔV). FIG. 26 shows transfer lines for different values of constant $V_X$. It is possible to obtain the LV transfer lines by adjusting the $DAC_X$ code by ±ΔX or by adding the offset (±ΔV). For instance, if $DAC_X$ code is incremented such that voltage output is increased by +ΔV (curve $V_X=V_A+\Delta V$), the loop will reduce the value of $V_{IN}$ to $$V_{IN} = V_{IN} - \frac{\Delta V \times G_X}{G_{LV}}$$

so that $V_{OUT}=V_{TARGET}$ can be maintained. Therefore, the control loop will converge at a $DAC_{IN}$ code far away from a high glitch code boundary.

Figure 27A:
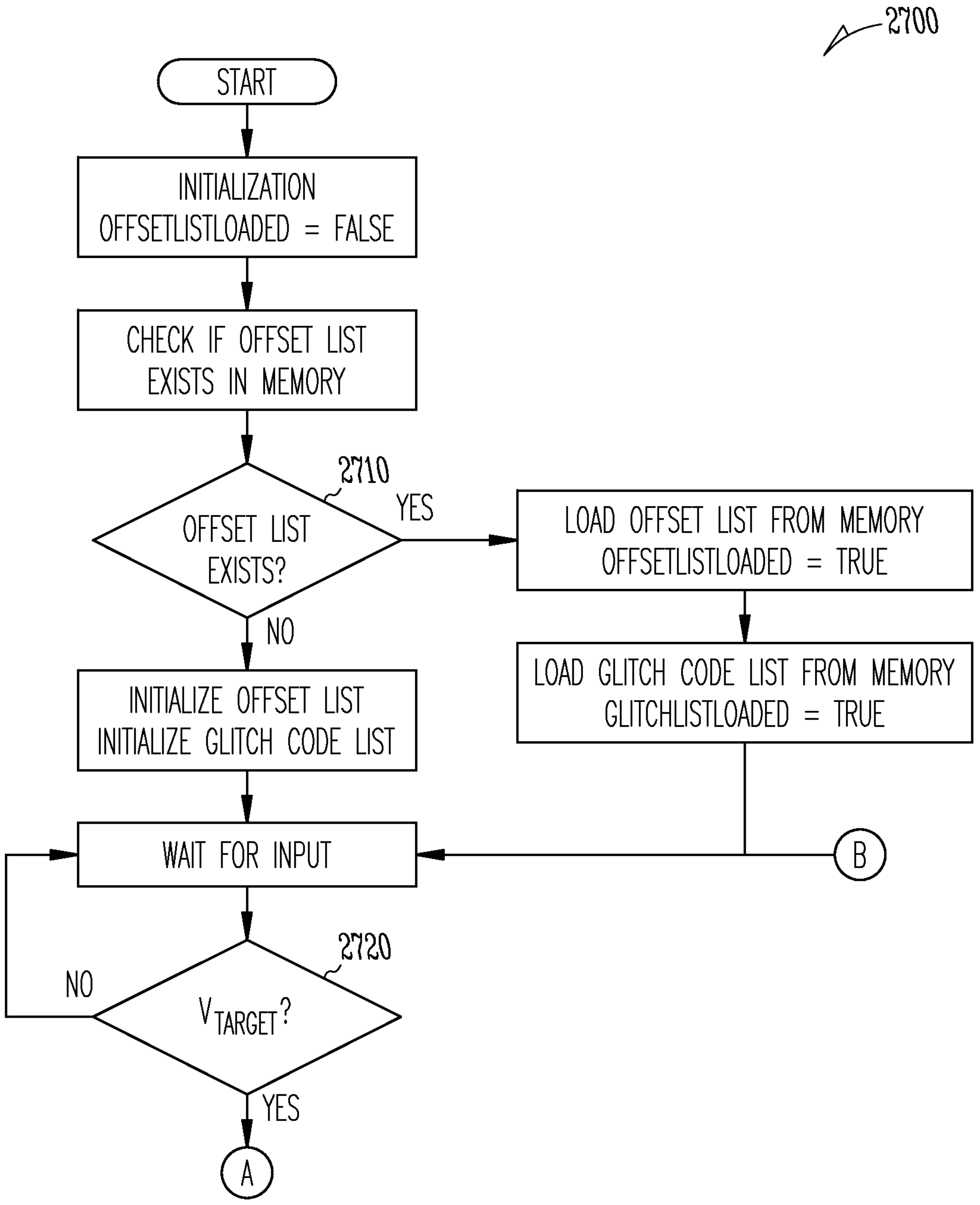
FIGS. 27A and 27B show a flow diagram of an example of a method of operating an amplifier system having one or more DACs.
Figure 27B:
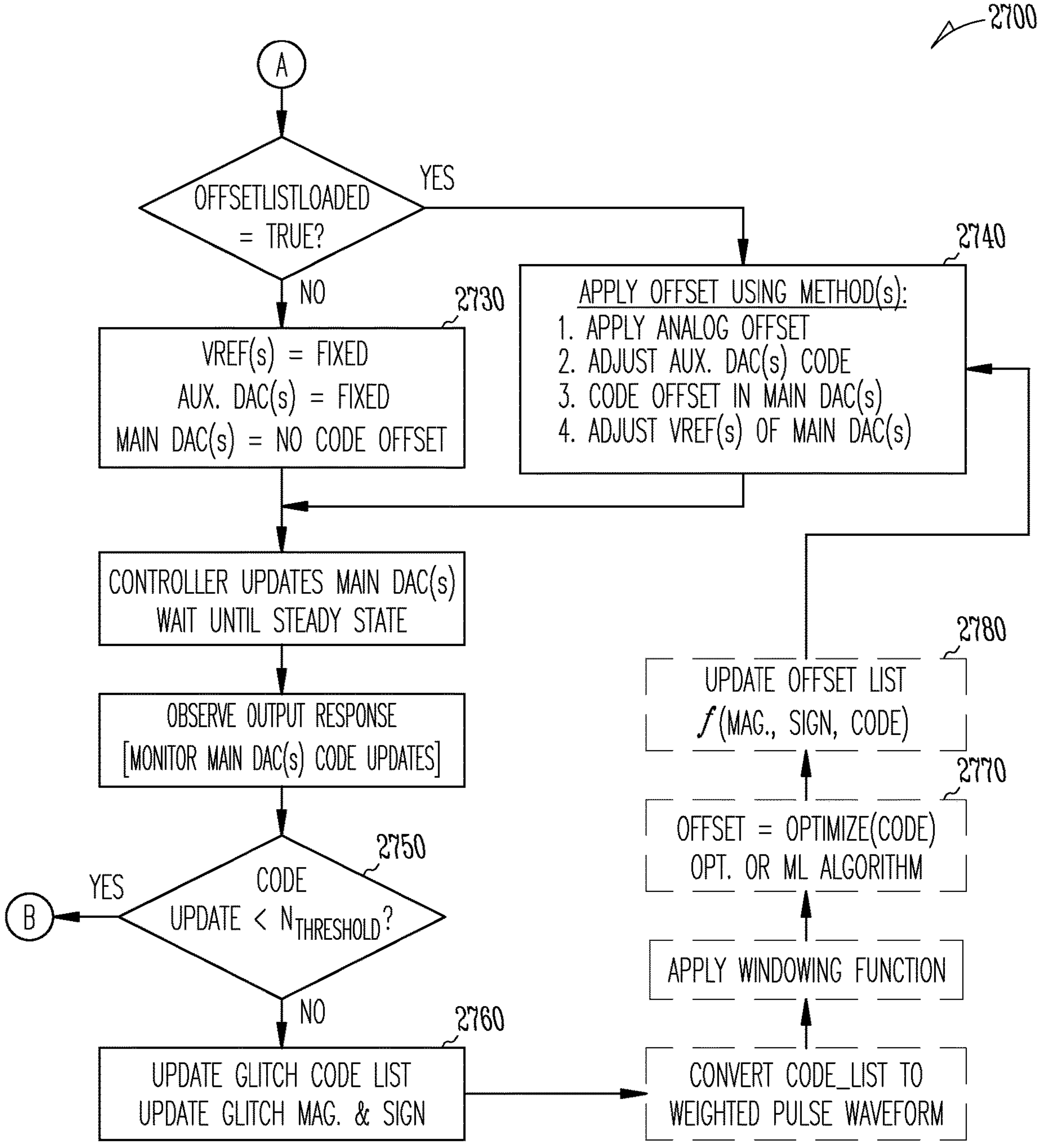

FIGS. 27A and 27B show a flow diagram of an example of a method 2700 of closed loop glitch mitigation in an amplifier system. The method 2700 uses an offset to transition the DAC codes away from a high-glitch DAC code condition. The control circuit can determine what offset to apply based on the glitch condition of the system.

FIG. 27A shows an initialization stage. At block 2710 it is determined if an offset list is stored in memory or otherwise available. If the offset list is available, the offset list and the glitch code list are loaded from memory into the control circuit or dedicated monitoring circuit. At block 2720, the system waits for the target ($V_{TARGET}$) and glitch threshold ($N_{THRESHOLD}$) to be set.

At block 2730 in FIG. 27B, if an offset list is not available, the control circuit sets the DAC code of the main DACs ($DAC_{IN}$) and the auxiliary DACs ($DAC_X$) to meet the target (e.g., $V_{OUT}=V_{TARGET}$). No offset is applied. Reference levels (e.g., $V_{REFS}$) may also be set to determine the range of the main DACs and auxiliary DACs.

At block 2740, if an offset list is available, the control circuit applies an offset to the control loop. The offset can be applied in different ways. For instance, the system can include an analog adder or subtractor circuit to apply the offset (voltage offset or current offset) to the summing node of the system as in the example of FIG. 15. In certain examples, the offset is applied using one or more auxiliary DACs as in the example of FIG. 18. In certain examples, the offset is included in a DAC code and the control circuit loads the DAC code that incorporates the offset. In other examples, the references for the DACs can be adjusted (e.g., by analog means or using auxiliary DACs) to include the offset.

When the DAC codes are set, the control loop of the system steers the output of the system toward the steady state output target (e.g., $V_{OUT} \approx V_{TARGET}$). The control circuit may make small changes (e.g., one or two LSBs) that are less than the threshold to the $DAC_{IN}$ code to compensate for small changes in conditions. The code updates are monitored and at block 2750 if the changes are less than the threshold ($N_{THRESHOLD}$ LSBs), the control circuit continues to monitor the system stability and a glitch flag is not raised or activated.

If a main DAC code change is needed that is greater than the $N_{THRESHOLD}$ LSBs, then a high-glitch flag signal is asserted or activated. At 2760, when a high-glitch code transition is encountered, the DAC codes can be recorded in memory. The control circuit (or dedicated monitoring circuit) also may record the sign magnitude of the glitch at a given transition based on peak or average code updates observed at steady state. Subsequently, a pre-determined offset value may be applied by the control circuit when a previously recorded high-glitch transition condition is expected. The pre-determined offset value may be used as part of a starting approximation to find a new steady state for the system.

At block 2770, the amount of offset to be applied for a given transition may be fixed or continuously updated based on an optimization algorithm or machine learning (ML) algorithm. For example, the amplifier system can observe DAC codes and from the DAC codes and detected glitching, the system can determine where the glitches are in the DAC codes and how much energy the glitches have. The system can deduce that the current DAC code space is in a high glitching condition and can apply one or both of DAC code changes and offsets to settle the main DAC or DACs away from the instability. Thus, the amplifier system can self-characterize the current system conditions.

At block 2780, the system may calculate the amount of offset needed as function of glitch magnitude, glitch sign, and DAC code and updates the offset list. The process returns to block 2740 to apply the calculated offset and returns to monitoring the system stability.

The glitch mitigation methods described herein up to this point can operate in the background without disrupting the normal operation of the system for an extended period. The glitch mitigation methods can detect when the control loop settles near a high-glitch DAC code transition and can capture information on the sign and relative magnitude of a glitch based on the DAC code updates made by the control circuit at steady state. The control circuit then may apply an offset with fixed amplitude or varying amplitude calculated by the amplifier system as a function of the characterized glitch parameters.

If a writable memory is available in the amplifier system, the control circuit or a dedicated monitoring circuit may record the high-energy glitch codes with relative magnitudes together with sign information. Other key artifacts may be recorded to enable efficient glitch mitigation. The amount of offset applied for a given code transition can be made proportional or inversely proportional to the relative magnitude and the sign of the glitch, and the offset may be continuously updated as the system encounters new code transitions with high glitches.

Alternatively, a system-level foreground calibration may be devised which may be run at power-up, when the system is idle and not operational, or periodically during system operation (e.g., where the operating conditions such as temperature, power dissipation, or load, have changed significantly). The result of the calibration is an offset list that can be stored in memory and loaded when configuring the amplifier system.

Figure 28A:
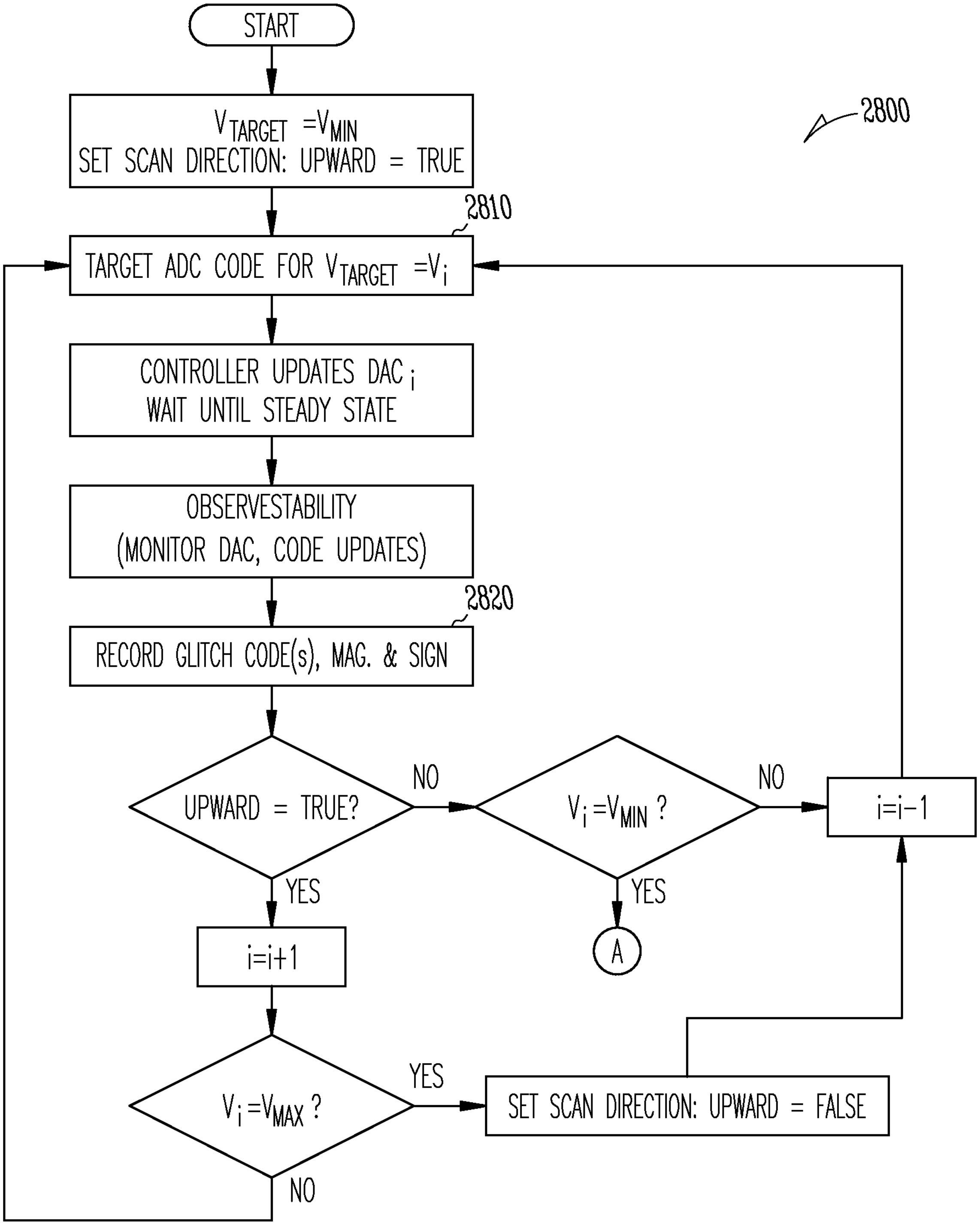
FIGS. 28A and 28B show a flow diagram of an example of a method of foreground calibration for an amplifier system having one or more DACs.
Figure 28B:
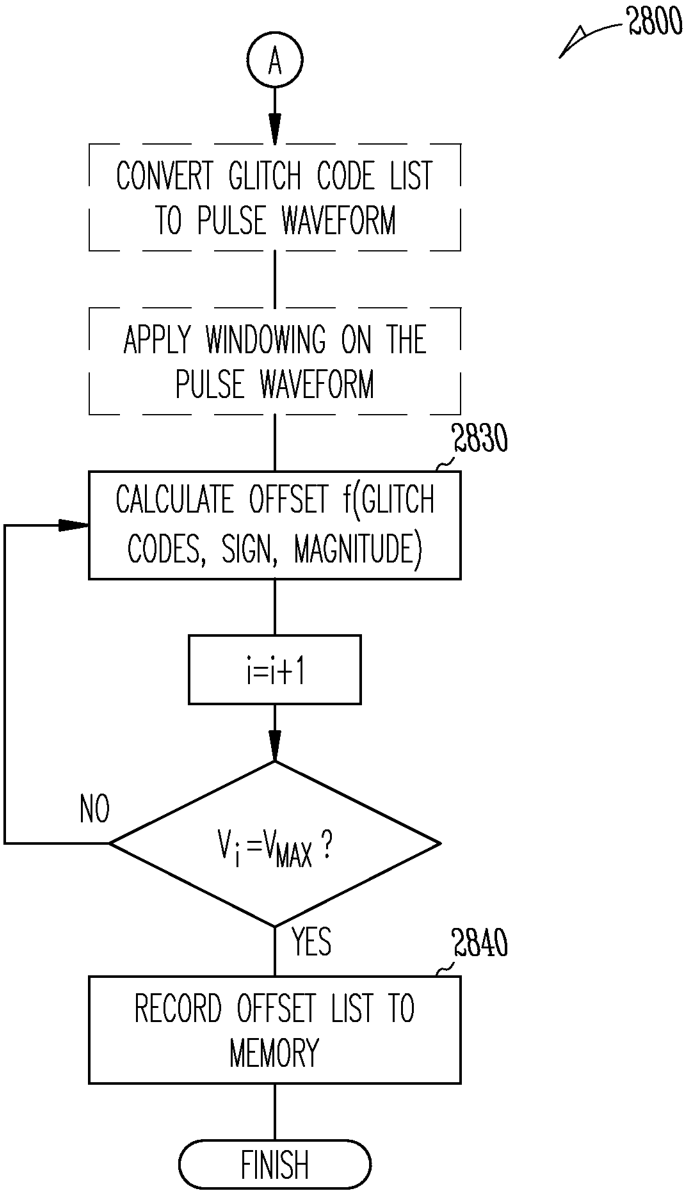

FIGS. 28A and 28B show a flow diagram of an example of a method 2800 of foreground calibration for glitch characterization and offset calculation in a closed loop amplifier system. Assuming a target voltage range from $V_{MIN}$ to $V_{MAX}$, during calibration for a given DAC of a single DAC system or a multi-DAC system, values for $V_{TARGET}$ values are swept up from $V_{MIN}$ to $V_{MAX}$ and then down from $V_{MAX}$ to $V_{MIN}$ (or vice versa).

At 2810, the corresponding target measure ADC code is set for a $V_{TARGET}$ value). At 2820, the system records DAC glitch magnitude and sign information in memory at each code transition based on the magnitude and direction of DAC code updates required at steady state. Only the glitches with magnitude (or energy) that are more than a set threshold ($N_{THRESHOLD}$) may be recorded to save memory space.

Once the high-energy DAC code transitions with sign and magnitude information are captured and recorded, at block 2830 the system may calculate the amount of offset that should be applied for each case during normal operation. The amount of offset can be calculated as a function of glitch codes, glitch magnitude and sign of the glitch. This way, all the relevant glitch characteristics could be determined for a system with multiple DACs without any glitch characterization data available beforehand. The system may also take advantage of previously characterization data during normal operation and/or to complete a faster system characterization.

At block 2840, the calculated offsets are stored in memory. This offset list is then available for loading into the control circuit or separate monitoring circuit of the system to shift the DAC code away from high-glitch transitions. An advantage of the system foreground calibration is that the system can methodically avoid high-glitch code transition during normal operation by applying predetermined offsets that are based on glitch information (e.g., glitch characteristic data) stored in memory.

The glitch mitigation process can involve machine learning as part of a process to identify DAC code changes when a high glitch transition condition is detected. Glitches from the DAC Code transitions is a negative attribute of the system and minimizing is desirable. The glitching optimization can be a minimization exercise. In machine learning, minimizing the glitches can be determined by optimizing a Loss Function or Cost Function. The Loss Function can be a combination of glitching attributes, and the goal of the machine learning is minimizing the attributes.

Population-based analysis can be used to determine which DAC code sets are desired and which are to be avoided in DAC code changes. Glitch performance of an amplifier system can have a multi-modal distribution with low-glitch codes grouped differently than high-glitch codes. The distribution may be DAC architecture dependent or system design dependent. For instance, multi-stage DACs may tend to have multi-modal patterns, while ladder DACs do not tend to have discrete sub-stages and thus may have different code distributions and may not exhibit a clearly multi-modal distribution. The optimization algorithm can analyze the glitching performance to determine glitch transitions that should be avoided. The energy or magnitude of the DAC glitches can be characterized or quantified. Code contingency can be performed on the worst glitches characterized by the system to maintain stable output. The characterized glitch data can be stored. A contingent DAC codeset can be chosen according to the previously recorded DAC glitch data. The code transitions may be limited to the codes available to the system. Glitch data analysis can be used to determine the DAC codeset for which the glitching is to be mitigated, thus avoiding potentially mitigating against code changes where the impact is not significant.

Figure 29:
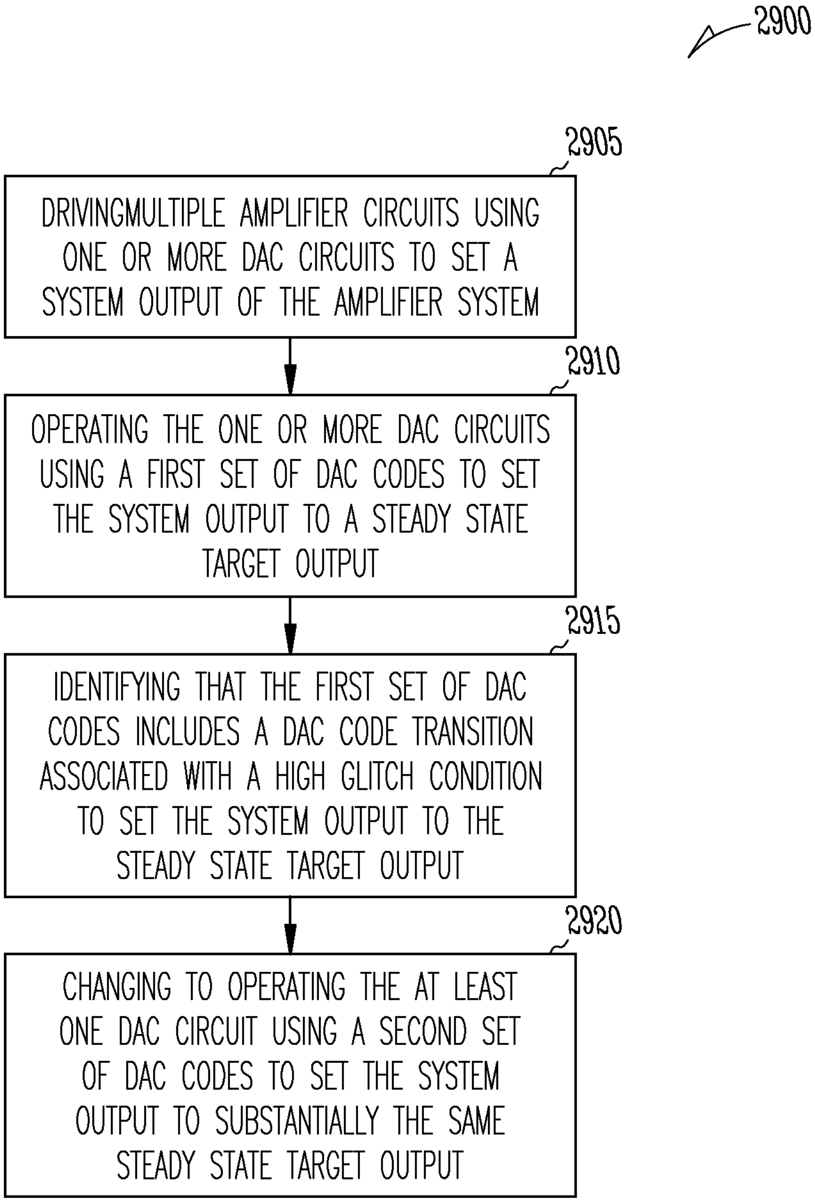
FIG. 29 is a flow diagram of an example of a method of feedback control of an amplifier system.

FIG. 29 is a flow diagram of an example of a method 2900 of feedback control of an amplifier system. The amplifier system can be any of the DAC controlled amplifier systems described herein. At block 2905, the amplifier circuits of the amplifier system are driven by one or more DAC circuits to set the output of the amplifier system. At block 2910, the DAC circuits are operated using a first set of DAC codes to set the system output to a steady state target output.

At block 2915, a control circuit of the amplifier system identifies that the first set of DAC codes includes a DAC code transition (or multiple DAC code transitions) associated with a high glitch condition and the high glitch DAC code transition is used, or will be used, to set the system output to the target output. At block 2920, the control circuit changes to operating the DAC circuits using a second set of DAC codes. The second set of DAC codes sets the output to the same target output, or substantially the same target output, as the first set of DAC codes. However, the second set of DAC codes does not include the DAC code transition associated with the high glitch condition. Thus, the glitch energy at the output is reduced.

The final codeset choice may be hardware constrained. The optimization algorithm may use knowledge of the DAC architecture in the analysis (e.g., certain code or bit transitions have a repeatable pattern throughout the codeset). Contingent DAC codesets can be determined based on knowledge of the design of the system. Contingent codesets may also be included to address unknown artifacts that may occur in the system (e.g., due to parasitics).

The glitch mitigation techniques described herein make use of the closed-loop setting, allowing the DACs to settle at different DAC codes while maintaining a target output voltage or current. The techniques provide glitch self-characterization as well as background and foreground calibration for closed-loop DAC glitch mitigation.

ADDITIONAL DESCRIPTION AND EXAMPLES

Example 1 includes subject matter (such as a method of feedback control of an amplifier system) comprising driving multiple amplifier circuits using at least one digital-to-analog converter (DAC) circuit to set a system output of the amplifier system; operating the at least one DAC circuit using a first set of DAC codes to set the system output to a steady state target output; detecting a high glitch condition at an output of the at least one DAC circuit when using the first set of DAC codes; and changing to operating the at least one DAC circuit using a second set of DAC codes to set the system output to substantially the same steady state target output, wherein operating the at least one DAC circuit using the second set of DAC codes reduces glitch energy at the output of the least one DAC circuit.

In Example 2, the subject matter of Example 1 optionally includes detecting a high-energy glitch transition that is greater than a threshold glitch transition when operating the at least one DAC circuit using the first set of DAC codes.

In Example 3, the subject matter of one or both of Examples 1 and 2 optionally includes identifying that the first set of DAC codes includes a DAC code transition associated with the high glitch condition when setting the system output to the steady state target output.

In Example 4, the subject matter of one or any combination of Examples 1-3 optionally includes setting the system output to the steady state target output using a control loop that includes a feedback circuit path; and adding an offset to the control loop to operate the at least one DAC circuit using the second set of DAC codes.

In Example 5, the subject matter of Example 4 optionally includes adding a programmable offset to the control loop using another DAC circuit.

In Example 6, the subject matter of one or any combination of Examples 1-5 optionally includes applying an output of the at least one DAC circuit to an input of a first amplifier circuit and an input of a second amplifier circuit of the multiple amplifier circuits when operating the amplifier system in a first mode; and applying the output of the at least one DAC circuit to the input of the first amplifier circuit and applying an output of another DAC circuit to the input of the second amplifier circuit in a second mode, wherein the second mode has a lower voltage output than the first mode.

In Example 7, the subject matter of one or nay combination of Examples 1-6 optionally includes driving multiple DAC channels, wherein each DAC channel includes a main DAC and an amplifier circuit, and the amplifier circuits of the DAC channels have different signal gain; operating the main DAC circuits of the DAC channels using the first set of DAC codes and summing outputs of the DAC channels to set the system output; and using a control loop to set the system output to the steady state target output and to change to operating the main DAC circuits using the second set of DAC codes to reduce ripple of the system output caused by the multiple DAC channels.

In Example 8, the subject matter of Example 7 optionally includes detecting a high-energy glitch transition that is greater than a threshold glitch transition when operating the at least one DAC circuit using the first set of DAC codes; determining an offset using a magnitude of the high-energy glitch transition and current DAC code; and selecting a set of DAC codes as the second set of DAC codes using the determined offset.

In Example 9, the subject matter of one or any combination of Examples 1-8 optionally includes updating a DAC code of the at least one DAC circuit using DAC code values selected from the first set of DAC codes to set the system output to the steady state target output; detecting when the DAC code of the at least one DAC circuit settles near a high-glitch DAC code transition when setting the system output to the steady state target output; and updating the DAC code of the at least one DAC circuit using DAC code values selected from the second set of DAC codes in response to the detecting.

Example 10 includes subject matter (such as an amplifier system) or can optionally be combined with one or any combination of Examples 1-9 to include such subject matter, comprising at least one digital to analog converter (DAC) circuit, wherein setting a DAC code in the at least one DAC circuit sets an output of the at least one DAC circuit; multiple amplifier circuits including inputs connected to the output of the at least one DAC circuit; a feedback circuit path connected to a system output of the amplifier system; and a control circuit connected to the at least one DAC circuit and the feedback circuit path. The control circuit is configured to operate the at least one DAC circuit using a first set of DAC codes to set the system output to a steady state output target; and change to operating the at least one DAC circuit using a second set of DAC codes to maintain the same steady state output target and to reduce ripple at the system output caused by the at least one DAC circuit.

In Example 11, the subject matter of Example 10 optionally includes a control loop that includes the feedback circuit and the control circuit; and a control circuit configured to detect a high glitch transition of the first set of DAC codes that is greater than a threshold glitch transition; and add an offset to the control loop to change to the selecting the DAC code from the second set of DAC codes.

In Example 12, the subject matter of Example 11 optionally includes another DAC circuit to add the offset to the control loop; and a control circuit configured to set the offset according to a magnitude of the high glitch transition and one or more DAC codes values corresponding to the high glitch transition.

In Example 13, the subject matter of one or both of Examples 11 and 12 optionally includes a summing node connected to outputs of the multiple amplifier circuits; multiple DAC circuits; and inputs of the multiple amplifier circuits are connected to the outputs of the multiple DAC circuits to form multiple DAC channels and the outputs of the multiple amplifier circuits are connected to the summing node. The control circuit is optionally configured to update DAC codes of the multiple DAC circuits to maintain the steady state output target; and add the offset to the summing node to change to selecting the DAC codes from the second set of DAC codes.

In Example 14, the subject matter of one or any combination of Examples 11-13 optionally includes a first amplifier circuit and a second amplifier circuit, and the at least one DAC circuit includes a first DAC circuit connected to an input of the first amplifier circuit and a second DAC circuit connected to an input of the second amplifier circuit. The control circuit is optionally configured to update the DAC codes of both the first DAC circuit and the second DAC circuit to apply an equal DAC output to the first amplifier circuit and the second amplifier circuit to set the system output to the steady state output target in a first mode; and update the DAC code of only the first DAC circuit to set the system output to the steady state output target in a second mode, wherein the second mode has a lower output voltage range than the first mode.

In Example 15, the subject matter of one or any combination of Examples 10-14 optionally includes a switch circuit and multiple amplifier circuits that include a first amplifier circuit and a second amplifier circuit, and the at least one DAC circuit includes a first DAC circuit and a second DAC circuit. The output of the first DAC circuit is connected to an input of the first amplifier circuit. The switch circuit is configured to connect the output of the first DAC circuit to an input of the second amplifier circuit in a first mode; and connect the output of the second DAC circuit to the input of the second amplifier circuit in a second mode, wherein the second mode has a lower voltage output range than the first mode.

In Example 16, the subject matter of one or any combination of Examples 10-15 optionally includes a system memory and a control circuit configured to sweep a DAC code of the at least one DAC code over a specified range of DAC code values; store DAC glitch characteristic data for DAC code transitions in the system memory; and detect the high glitch transition using the stored DAC glitch magnitudes for the DAC code transitions.

In Example 17, the subject matter of one or any combination of Examples 10-16 optionally includes a feedback circuit path that includes an analog-to-digital converter (ADC) circuit operatively coupled to the system output; and a control circuit configured to set the DAC code of the at least one DAC circuit to set a system output current to a steady state target output current.

In Example 18, the subject matter of one or any combination of Examples 10-17 optionally includes a sense impedance at the system output; a feedback circuit path that includes an analog-to-digital converter (ADC) circuit operatively coupled to the sense impedance; and a control circuit configured to set the DAC code of the at least one DAC circuit to set a system output current to a steady state target output current.

Example 19 includes subject matter (such as a power supply system having closed loop control) or can optionally be combined with one or any combination of Examples 1-18 to include such subject matter, comprising multiple digital to analog converter (DAC) channels, each DAC channel including a DAC circuit connected to an input of an amplifier circuit; a summing node connected to outputs of the amplifier circuits of the DAC channels to provide a system output; and control circuit operatively coupled to the DAC channels and the system output. The control circuit is configured to update the DAC circuits of the DAC channels with DAC codes to adjust the system output to a steady state target output in a steady state, wherein the DAC codes are selected from a first set of DAC codes; detect when the DAC codes selected from the first set of DAC codes result in a glitch condition at outputs of the DAC circuits in the steady state; and change to selecting the DAC codes from a second set of DAC codes that maintain the same steady state target output and reduce glitching at the outputs of the DAC circuits.

In Example 20 the subject matter of Example 19 optionally includes a control circuit configured to determine a control loop offset according to a glitch magnitude of the high-glitch DAC code transitions; and add the control loop offset to the summing node to change to the selecting the DAC codes from the second set of DAC codes.

These non-limiting examples can be combined in any permutation or combination. The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

What is claimed is:

1. A method of feedback control of an amplifier system, the method comprising:

driving multiple amplifier circuits using at least one digital-to-analog converter (DAC) circuit to set a system output of the amplifier system;

sweeping a DAC code of the at least one DAC code over a specified range of DAC code values;

storing DAC glitch characteristic data for DAC code transitions in a system memory;

detecting a high-energy glitch transition using the stored DAC glitch magnitudes for the DAC code transitions;

operating the at least one DAC circuit using a first set of DAC codes to set the system output to a steady state target output;

detecting a high glitch condition at an output of the at least one DAC circuit when using the first set of DAC codes; and changing to operating the at least one DAC circuit using a second set of DAC codes to set the system output to substantially the same steady state target output, wherein operating the at least one DAC circuit using the second set of DAC codes reduces glitch energy at the output of the least one DAC circuit.

2. The method of claim 1, wherein detecting the high glitch condition includes detecting a high-energy glitch transition that is greater than a threshold glitch transition when operating the at least one DAC circuit using the first set of DAC codes.

3. The method of claim 1, wherein detecting the high glitch condition includes identifying that the first set of DAC codes includes the a high-energy glitch transition associated with the high glitch condition when setting the system output to the steady state target output.

4. The method of claim 1, including:

setting the system output to the steady state target output using a control loop that includes a feedback circuit path; and wherein the changing to operating the at least one DAC circuit using a second set of DAC codes includes adding an offset to the control loop to operate the at least one DAC circuit using the second set of DAC codes.

5. The method of claim 4, wherein the adding the offset to the control loop includes adding a programmable offset to the control loop using another DAC circuit.

6. The method of claim 1, including:

applying an output of the at least one DAC circuit to an input of a first amplifier circuit and an input of a second amplifier circuit of the multiple amplifier circuits when operating the amplifier system in a first mode; and applying the output of the at least one DAC circuit to the input of the first amplifier circuit and applying an output of another DAC circuit to the input of the second amplifier circuit in a second mode, wherein the second mode has a lower voltage output than the first mode.

7. The method of claim 1, wherein the driving the multiple amplifier circuits includes:

driving multiple DAC channels, wherein each DAC channel includes a main DAC and an amplifier circuit, and the amplifier circuits of the DAC channels have different signal gain;

operating the main DAC circuits of the DAC channels using the first set of DAC codes and summing outputs of the DAC channels to set the system output; and using a control loop to set the system output to the steady state target output and to change to operating the main DAC circuits using the second set of DAC codes to reduce ripple of the system output caused by the multiple DAC channels.

8. The method of claim 7, including:

detecting a high-energy glitch transition that is greater than a threshold glitch transition when operating the at least one DAC circuit using the first set of DAC codes;

determining an offset using a magnitude of the high-energy glitch transition and current DAC code; and selecting a set of DAC codes as the second set of DAC codes using the determined offset.

9. The method of claim 1, including:

updating a DAC code of the at least one DAC circuit using DAC code values selected from the first set of DAC codes to set the system output to the steady state target output;

detecting when the DAC code of the at least one DAC circuit settles near a high-glitch DAC code transition when setting the system output to the steady state target output; and updating the DAC code of the at least one DAC circuit using DAC code values selected from the second set of DAC codes in response to the detecting.

10. An amplifier system including:

multiple digital to analog converter (DAC) circuits including a first DAC circuit and a second DAC circuit, wherein setting a DAC code in the DAC circuits sets an output of the at least one DAC circuit;

multiple amplifier circuits including a first amplifier circuit and a second amplifier circuit, wherein an output of the first DAC circuit is connected to an input of the first amplifier circuit;

a switch circuit configured to connect the output of the first DAC circuit to an input of the second amplifier circuit in a first mode, and connect the output of the second DAC circuit to the input of the second amplifier circuit in a second mode that has a lower voltage output range than the first mode;

a feedback circuit path connected to a system output of the amplifier system; and a control circuit connected to at least one DAC circuit of the multiple DAC circuits and the feedback circuit path, wherein the control circuit is configured to:

operate the at least one DAC circuit using a first set of DAC codes to set the system output to a steady state output target; and change to operating the at least one DAC circuit using a second set of DAC codes to maintain the same steady state output target and to reduce ripple at the system output caused by the at least one DAC circuit.

11. The amplifier system of claim 10, including:

a control loop that includes the feedback circuit and the control circuit;

wherein the control circuit is configured to:

detect a high glitch transition of the first set of DAC codes that is greater than a threshold glitch transition; and add an offset to the control loop to change to the selecting the DAC code from the second set of DAC codes.

12. The amplifier system of claim 11, including:

another DAC circuit to add the offset to the control loop; and wherein the control circuit is configured to set the offset according to a magnitude of the high glitch transition and one or more DAC codes values corresponding to the high glitch transition.

13. The amplifier system of claim 11, including:

a summing node connected to outputs of the multiple amplifier circuits;

wherein the at least one DAC circuit includes multiple DAC circuits;

wherein the inputs of the multiple amplifier circuits are connected to the outputs of the multiple DAC circuits to form multiple DAC channels and the outputs of the multiple amplifier circuits are connected to the summing node; and wherein the control circuit is configured to:

update DAC codes of the multiple DAC circuits to maintain the steady state output target; and add the offset to the summing node to change to selecting the DAC codes from the second set of DAC codes.

14. The amplifier system of claim 11, wherein the multiple amplifier circuits include a first amplifier circuit and a second amplifier circuit, and the at least one DAC circuit includes a first DAC circuit connected to an input of the first amplifier circuit and a second DAC circuit connected to an input of the second amplifier circuit;

wherein the control circuit is configured to:

update the DAC codes of both the first DAC circuit and the second DAC circuit to apply an equal DAC output to the first amplifier circuit and the second amplifier circuit to set the system output to the steady state output target in a first mode; and update the DAC code of only the first DAC circuit to set the system output to the steady state output target in a second mode, wherein the second mode has a lower output voltage range than the first mode.

15. The amplifier system of claim 10, including:

a system memory; and wherein the control circuit is configured to:

sweep a DAC code of the at least one DAC circuit over a specified range of DAC code values;

store DAC glitch characteristic data for DAC code transitions in the system memory; and detect the high glitch transition using the stored DAC glitch magnitudes for the DAC code transitions.

16. The amplifier system of claim 10, wherein the feedback circuit path that includes an analog-to-digital converter (ADC) circuit operatively coupled to the system output; and wherein the control circuit is configured to set the DAC code of the at least one DAC circuit to set a system output voltage to a steady state output target voltage.

17. The amplifier system of claim 10, including:

a sense impedance at the system output;

wherein the feedback circuit path that includes an analog-to-digital converter (ADC) circuit operatively coupled to the sense impedance; and wherein the control circuit is configured to set the DAC code of the at least one DAC circuit to set a system output current to a steady state target output current.

18. A power supply system having closed loop control, the power supply system comprising:

multiple digital to analog converter (DAC) channels, each DAC channel including a DAC circuit connected to an input of an amplifier circuit;

a summing node connected to outputs of the amplifier circuits of the DAC channels to provide a system output;

a system memory; and a control circuit operatively coupled to the DAC channels and the system output, wherein the control circuit is configured to:

sweep a DAC code of at least one DAC circuit of the DAC channels over a specified range of DAC code values;

store DAC glitch characteristic data for DAC code transitions in the system memory;

update the DAC circuits of the DAC channels with DAC codes to adjust the system output to a steady state target output in a steady state, wherein the DAC codes are selected from a first set of DAC codes;

detect when the DAC codes selected from the first set of DAC codes result in a glitch condition at outputs of the DAC circuits in the steady state including detecting a high glitch transition using the stored DAC glitch characteristic data; and change to selecting the DAC codes from a second set of DAC codes that maintain the same steady state target output and reduce glitching at the outputs of the DAC circuits.

19. The power supply system of claim 18, wherein the control circuit is configured to:

determine a control loop offset according to a glitch magnitude of the high-glitch DAC code transitions; and add the control loop offset to the summing node to change to the selecting the DAC codes from the second set of DAC codes.

* * * * *